United States Patent
Yang et al.

(10) Patent No.: US 12,142,315 B2
(45) Date of Patent: Nov. 12, 2024

(54) LOW POWER MULTI-LEVEL CELL (MLC) PROGRAMMING IN NON-VOLATILE MEMORY STRUCTURES

(71) Applicant: SanDisk Technologies LLC, Addison, TX (US)

(72) Inventors: Xiang Yang, Santa Clara, CA (US); Muhammad Masuduzzaman, Chandler, AZ (US); Jiacen Guo, Cupertino, CA (US)

(73) Assignee: SanDisk Technologies LLC

( * ) Notice: Subject to any disclaimer, the term of this patent is extended or adjusted under 35 U.S.C. 154(b) by 163 days.

(21) Appl. No.: 17/825,193

(22) Filed: May 26, 2022

(65) Prior Publication Data

US 2023/0386569 A1    Nov. 30, 2023

(51) Int. Cl.
G11C 11/56    (2006.01)
G11C 16/04    (2006.01)
G11C 16/10    (2006.01)

(52) U.S. Cl.
CPC ...... G11C 11/5628 (2013.01); G11C 11/5671 (2013.01); G11C 16/0483 (2013.01); G11C 16/10 (2013.01)

(58) Field of Classification Search
None
See application file for complete search history.

(56) References Cited

U.S. PATENT DOCUMENTS

| | | | |
|---|---|---|---|
| 6,282,145 B1 * | 8/2001 | Tran | G11C 27/005 365/230.06 |
| 2004/0233716 A1 * | 11/2004 | Tran | G11C 16/24 365/185.09 |
| 2008/0310222 A1 * | 12/2008 | Roohparvar | G11C 29/021 365/185.24 |
| 2014/0146606 A1 | 5/2014 | Nazarian et al. | |
| 2015/0179268 A1 | 6/2015 | Kim et al. | |
| 2016/0099059 A1 | 4/2016 | Chen et al. | |
| 2019/0341113 A1 | 11/2019 | Yip | |
| 2021/0233589 A1 | 7/2021 | Yang et al. | |

* cited by examiner

*Primary Examiner* — Tan T. Nguyen
(74) *Attorney, Agent, or Firm* — Dickinson Wright PLLC; Steven C. Hurles

(57) ABSTRACT

A method for programming a memory array of a non-volatile memory structure, the memory comprising a population of MLC NAND-type memory cells, wherein the method comprises applying: (1) an inhibit condition to one or more bit lines of the memory array, and (2) a zero voltage condition to one or more bit lines of the memory array such that less than half of the adjacent bit lines of the memory array experience a voltage swing between the inhibit condition and the zero voltage condition.

18 Claims, 20 Drawing Sheets

LOW POWER MULTI-LEVEL CELL (MLC) PROGRAMMING IN NON-VOLATILE MEMORY STRUCTURES

TECHNICAL FIELD

This disclosure relates to non-volatile memory storage systems in solid-state drives or other devices, including but not limited to flash drives or embedded/removable flash packages. More specifically, this disclosure relates to systems and methods for programming non-volatile memory structures.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices. Furthermore, advances in non-volatile memory structures have led to significant increases in their storage density capability and a reduction in power consumption, thereby lowering the per-bit and bit-per-chip cost.

Generally, a non-volatile memory device may be comprised of one or more arrays of individual memory cells. With respect to some flash memory types, each memory cell is comprised of a floating gate that is positioned above and isolated from a channel region of a semiconductor substrate, wherein the floating gate is positioned between the source and drain regions. Also, a control gate is provided over and isolated from the floating gate, wherein the threshold voltage ($V_{th}$) of the resulting transistor is then controlled by and dependent upon an amount of charge that is retained on the floating gate. Specifically, in a switch-like manner, a minimum amount of voltage that must be applied to the control gate before the transistor is activated to permit conduction between its source and its drain regions is, therefore, determined by the level of charge that is retained on the floating gate. As a result, bit-value data can be programmed onto and erased from a memory cell by precisely changing the level of electron charges on a floating gate in order to change the threshold voltage ($V_{th}$) characteristic of the transistor. In an array structure, the memory cells are addressable by word lines (rows) and bit lines (columns).

One type of non-volatile memory storage that is defined by this general structure is referred to as NAND flash memory due to its electrical characteristics, which are based on a NAND logic gate.

As explained in detail below, the number of bits that can be stored in an individual memory cell is dependent upon the number of distinct voltage ranges that may be partitioned within the threshold voltage ($V_{th}$) window of the memory cell. For example, to store one bit of data (referred to as a binary data), the possible threshold voltages ($V_{th}$) of the memory cell are divided into two ranges, wherein the two ranges are assigned as logical data "1" and "0" respectively. Therefore, a memory cell of this type of storage density may be referred to as a "single-level cell" or "SLC."

By further partitioning the threshold voltage ($V_{th}$) window of a memory cell into additional distinct voltage ranges, multiple levels of information can be stored. Thus, such a memory cell may be referred to as a "multi-state cell." For example, in order to store two bits of data, the threshold voltage ($V_{th}$) window of a cell may be partitioned into four distinct voltage ranges (or states), wherein each voltage range is assigned a certain bit value that is equal to, for example, "11," "10," "01," and "00." Accordingly, following an erase operation, the threshold voltage ($V_{th}$) is negative and, therefore, may be defined as logic "11." Therefore, the positive threshold voltages may be used for the states of "10," "01, "00." A memory cell of this storage density may be referred to as, for example, a "multi-level cell" or "MLC."

In another example, in order to store three bits of data, the voltage threshold window of a cell may be partitioned into eight distinct voltage ranges (or states), wherein each range is assigned a certain bit value equal to, for example, "111," "110," "100," "010," "011," "000," "001," and "101." Therefore, a memory cell of this storage density may be referred to, for example, as a "tri-level" or "triple-level cell" ("TLC").

In a further example, to store four bits of data, the threshold voltage ($V_{th}$) window of a memory cell may be partitioned into 16 distinct voltage ranges (or states), wherein each voltage range is assigned a certain bit value equal to, for example, "1111," "1110," "1100," "1000," "0111," "0011," "0001," "0000," "0001," "1001," "1101," "1011," "0110," "0100," "0101," and "1010." Accordingly, a memory cell of this type of storage density may be referred to, for example, as a "quad-level cell" or "QLC."

In addition to the increasing storage densities with respect to a single memory cell, advances in non-volatile memory array structures have led to memory cells being stacked in a vertical direction with respect to a semiconductor substrate, thereby creating a three-dimensional array structure as opposed to a planar two-dimensional array structure.

The specific relationship between the data that is programmed into a memory cell and the threshold voltage levels of the memory cell depends upon the data encoding scheme that is adopted for the memory cells.

Therefore, a memory device that comprises multi-state data (by incorporating MLC and/or TLC-type and/or QLC-type cells) has an increased storage capacity using the same MOSFET structure and wafer size as an SLC-type cell and, as a result, provides a beneficial comparative cost per bit savings. However, as a consequence of the increased density and the tightened tolerances between the partitioned voltage ranges of multi-state memory cells, programming operations inherently occur at a slower speed, and consume significantly more power, relative to a single-state memory cell because the data is being programmed to multiple target threshold voltage ($V_{th}$) ranges. Therefore, it would be beneficial to derive technologies and/or methodologies that will improve the performance parameters or characteristics of multi-state programming operations, including, for example, increasing the programming speed and reducing the power consumption.

SUMMARY

Various embodiments include a method for programming a memory array of a non-volatile memory structure, comprising: initiating a programming operation with respect to a population of MLC type memory cells comprising the memory array, wherein the programming operation comprises: (i) in a first program pulse, programming a first programmable state according to a first programming voltage, (ii) in a second program pulse, programming a second programmable state according to a second programming voltage, and (iii) in a third program pulse, programming a third programmable state according to a third programming voltage, wherein during each of the first program pulse, second program pulse, and third program pulse, applying: (1) an inhibit condition to one or more bit lines of the memory array, and (2) a zero voltage condition to one or more bit lines of the memory array such that less than half of the adjacent bit lines of the memory array experience a voltage swing between the inhibit condition and the zero voltage condition.

Other embodiments include a memory controller comprising: (1) a communication pathway that is configured to couple to a memory array of a non-volatile memory structure, and (2) the memory controller is configured to: initiate a programming operation with respect to a population of MLC type memory cells comprising the memory array, wherein the programming operation comprises: (i) in a first program pulse, programming a first programmable state according to a first programming voltage; (ii) in a second program pulse, programming a second programmable state according to a second programming voltage; and (iii) in a third program pulse, programming a third programmable state according to a third programming voltage, wherein during each of the first program pulse, the second program pulse, and the third program pulse, apply: an inhibit condition to one or more bit lines of the memory array; and a zero voltage condition to one or more bit lines of the memory array such that less than half of the adjacent bit lines of the memory array experience a voltage swing between the inhibit condition and the zero voltage condition.

Additional embodiments include a non-volatile memory system that comprises: a memory array comprising a population of MLC type memory cells, and a memory controller coupled to the memory array and: (1) initiating a programming operation with respect to the memory array, the programming operation comprising: (i) in a first program pulse, programming a first programmable state according to a first programming voltage; (ii) in a second program pulse, programming a second programmable state according to a second programming voltage; and (iii) in a third program pulse, programming a third programmable state according to a third programming voltage, (2) wherein during each of the first program pulse, the second program pulse, and the third program pulse, the memory controller applies: (i) an inhibit condition to one or more bit lines of the memory array; and (ii) a zero voltage condition to one or more bit lines of the memory array such that less than half of adjacent bit lines of the memory array experience a voltage swing between the inhibit condition and the zero voltage condition.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which.

DETAILED DESCRIPTION

Figure 1:
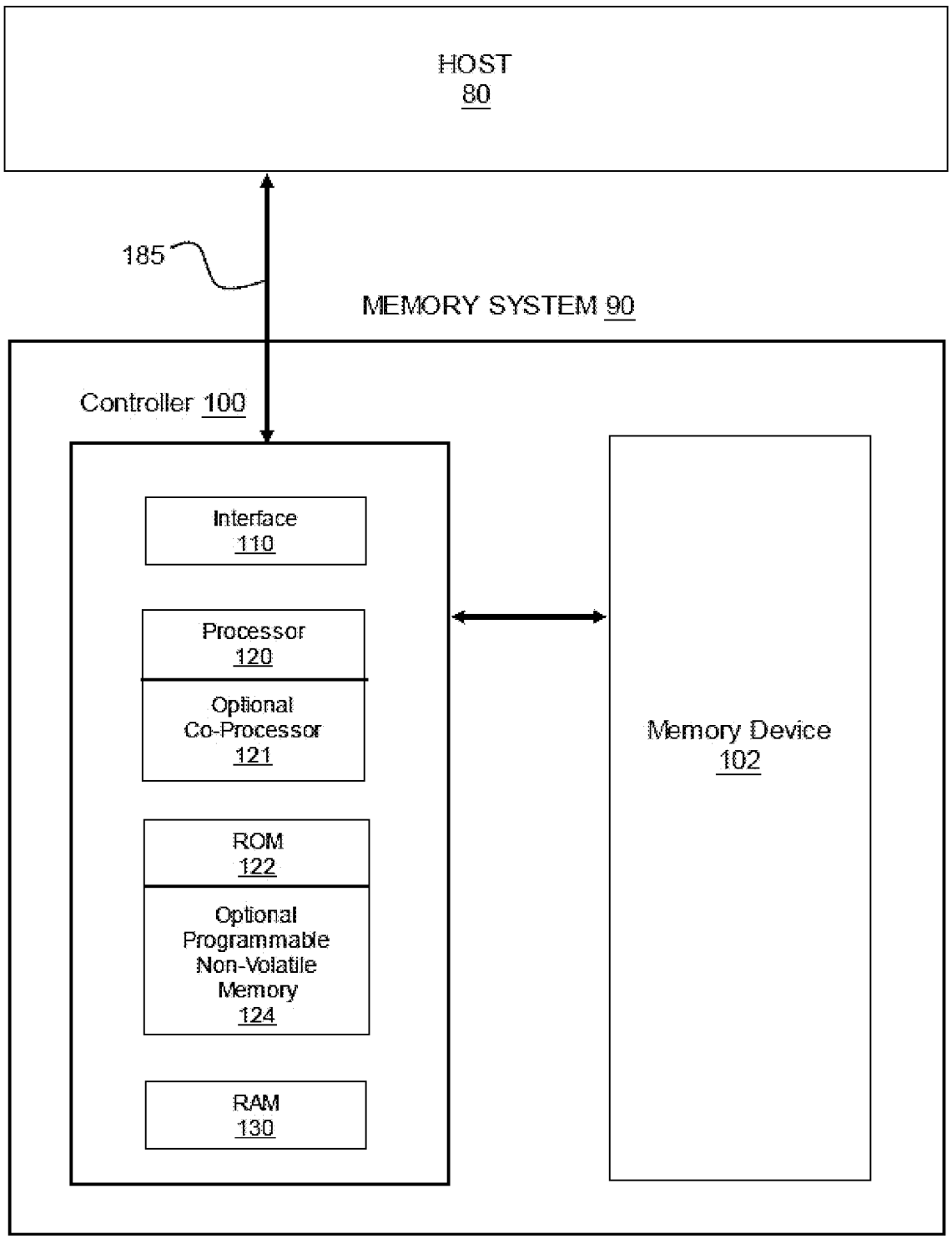
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays 200 of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, programmable non-volatile memory 124, and additional components. The controller 100 may, for example, be in the form of one or more application-specific integrated circuits (ASIC) in which the components included in such an ASIC generally depend on the particular application.

Figure 2:
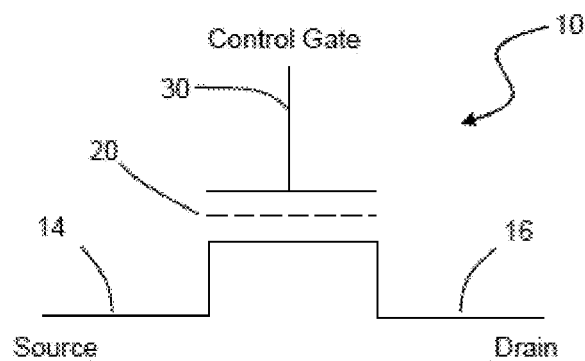
FIG. 2 is a schematic depiction of a non-volatile memory cell, in accordance with exemplary embodiments.

With respect to the memory array 200 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of a respective bit line (BL).

Figure 3:
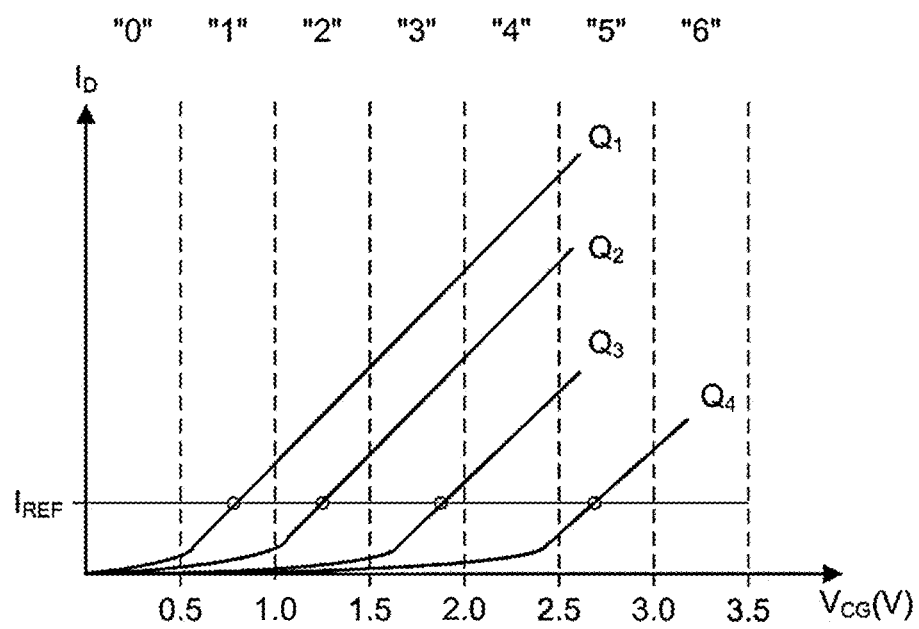
FIG. 3 depicts the relationship between a source-drain current ID and a control gate voltage $V_{CG}$ for four different charges Q1-Q4 that a floating gate of a non-volatile memory cell may be selectively storing at any one time and at a fixed drain voltage, in accordance with exemplary embodiments.

FIG. 3 provides a graphical illustration of the correlation between the source-drain current ID and control gate voltage $V_{CG}$ for, for example, a non-volatile memory cell 10 having four different charge states Q1-Q4 that the floating gate may be selectively storing at any given time. As shown, with a fixed drain voltage bias, there exists four solid ID versus $V_{CG}$ curves representing four charge levels that can be programmed on a floating gate of the memory cell, wherein the four charge levels respectively correspond to four of eight possible memory states. Therefore, as an example, the threshold voltage window of a population of memory cells may range from 0.5 V to 3.5 V. In such an example, seven programmed memory states assigned as "0," "1," "2," "3," "4," "5," "6," respectively, and one erased state (which is not shown in FIG. 3), may be demarcated by partitioning the threshold window into regions at intervals of 0.5 V each. Accordingly, if a reference current, $I_{REF}$, of 2 µA is used as shown, then a cell programmed with Q1 voltage may be considered to be in a memory state "1" as its curve intersects with $I_{REF}$ in the region of the threshold window that is demarcated by the voltage range $V_{CG}$=0.5 V and 1.0 V. Similarly, Q4 is in a memory state "5."

Thus, as mentioned above, the more states that a memory cell 10 is made to store, the more finely divided is its threshold voltage window. For example, in a memory cell 10 that has a threshold voltage window ranging from −1.5 V to 5 V, thereby providing a possible maximum width of 6.5 V, and is to store 16 memory states, each state may only occupy a voltage range of from 200 mV to 300 mV. Such a narrow voltage range will require higher precision in programming and reading operations in order to achieve the required resolution.

Figure 4A:
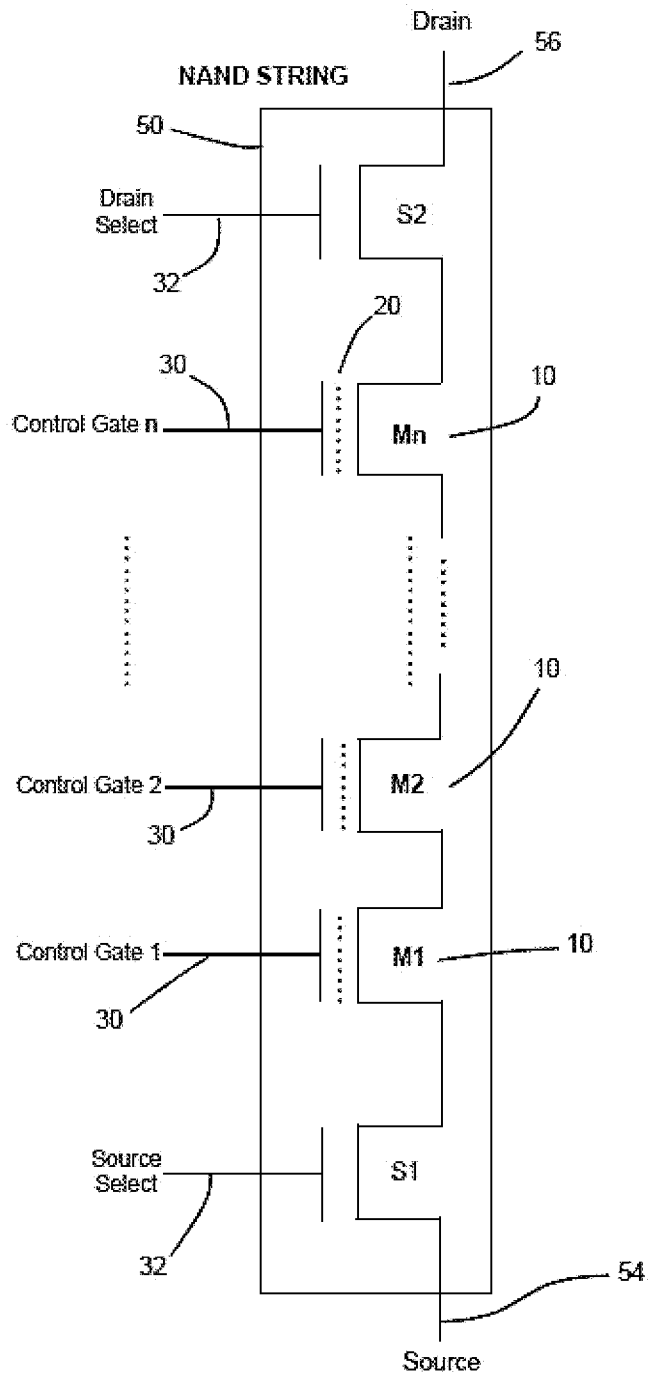
FIG. 4A is a schematic depiction of a series of NAND-type memory cells that are organized into a string, in accordance with exemplary embodiments.

Individual memory cells 10 are organized into strings in which the memory cells are placed in series. For example, depicted in FIG. 4A is an exemplary embodiment of a string 50 comprising NAND-type memory cells in which the series of the cells' respective transistor elements M1, M2, Mn (wherein "n" may equal 4, 8, 16 or higher) are daisy-chained with respect to their sources and drains. Further, as discussed with respect to FIG. 3, each memory transistor 10 in the string 50 has a charge storage element 20 (e.g., a floating gate) for storing a certain amount of charge so as to represent an intended memory state of that cell. And, as explained in greater detail below, each memory transistor 10 comprises a control gate 30 that allows control over the read and write operations. Present at the source terminal 54 and drain terminal 56 of the string 50 are select transistors S1, S2 that control the transistor elements' connection to the outlying memory array. Specifically, when the source select transistor S1 is turned on, the source terminal 54 is coupled to a source line. Likewise, when the drain select transistor S2 is turned on, the drain terminal 56 is coupled to a bit line of the memory array.

Figure 4B:
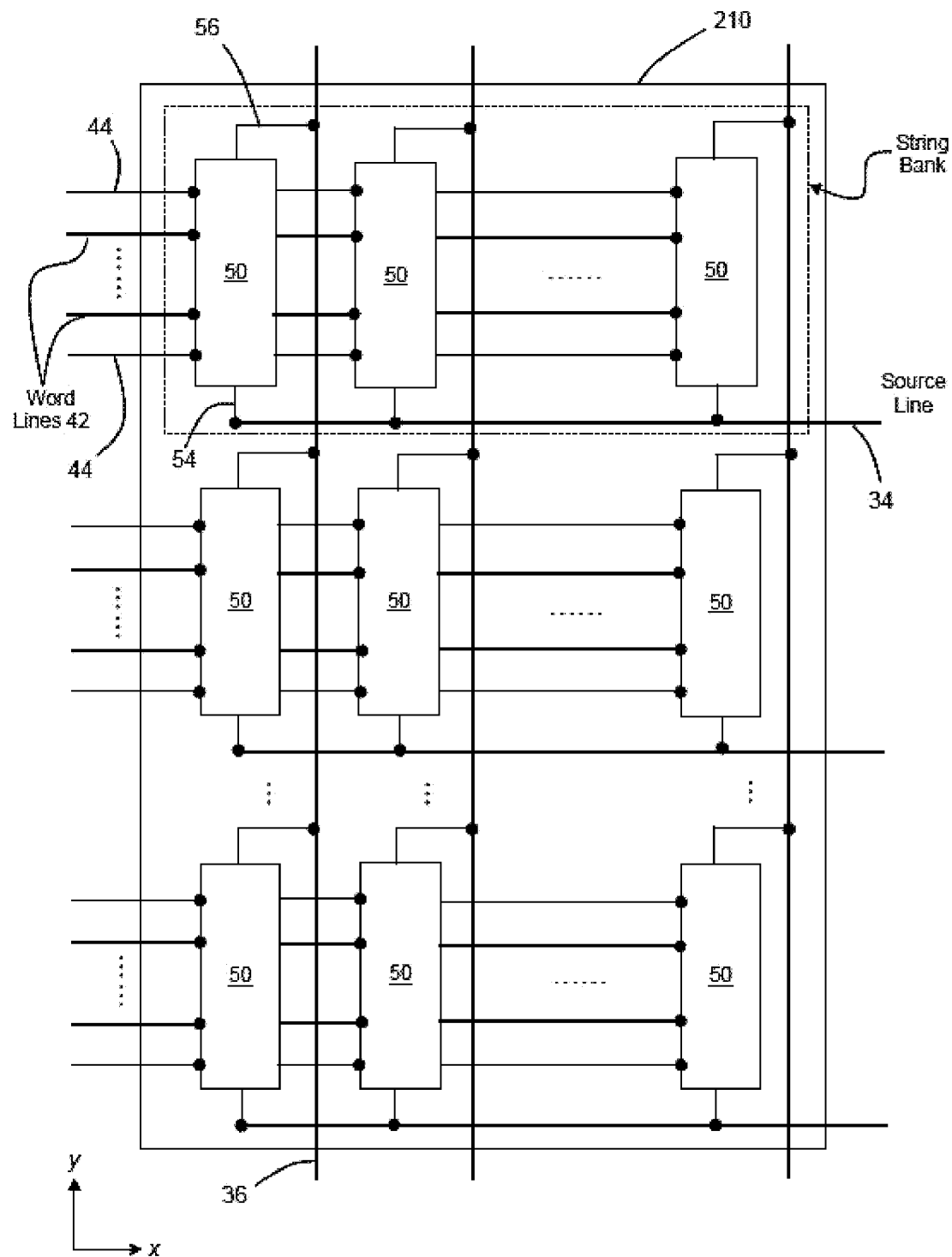
FIG. 4B is a schematic depiction of a memory array comprising a plurality of NAND-type strings, such as the type depicted in FIG. 4A, in accordance with exemplary embodiments.

Expanding outward a hierarchical level, FIG. 4B is a schematic diagram depicting an exemplary embodiment of a memory array 210 comprised of a plurality of NAND strings 50 of the type illustrated in FIG. 4A. Along each column of NAND strings 50, a bit line 36 is coupled to the drain terminal 56 of each NAND string. In addition, along each bank of NAND strings 50, a source line 34 is coupled to the source terminals 54 of each NAND string. Further, the control gates 30 of the memory transistors 10 in a row of memory cells in the bank of NAND strings 50 are connected to the same word line 42. Accordingly, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, a conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provides control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines 42 and select lines 44 of the bank of NAND strings 50.

Figure 5:
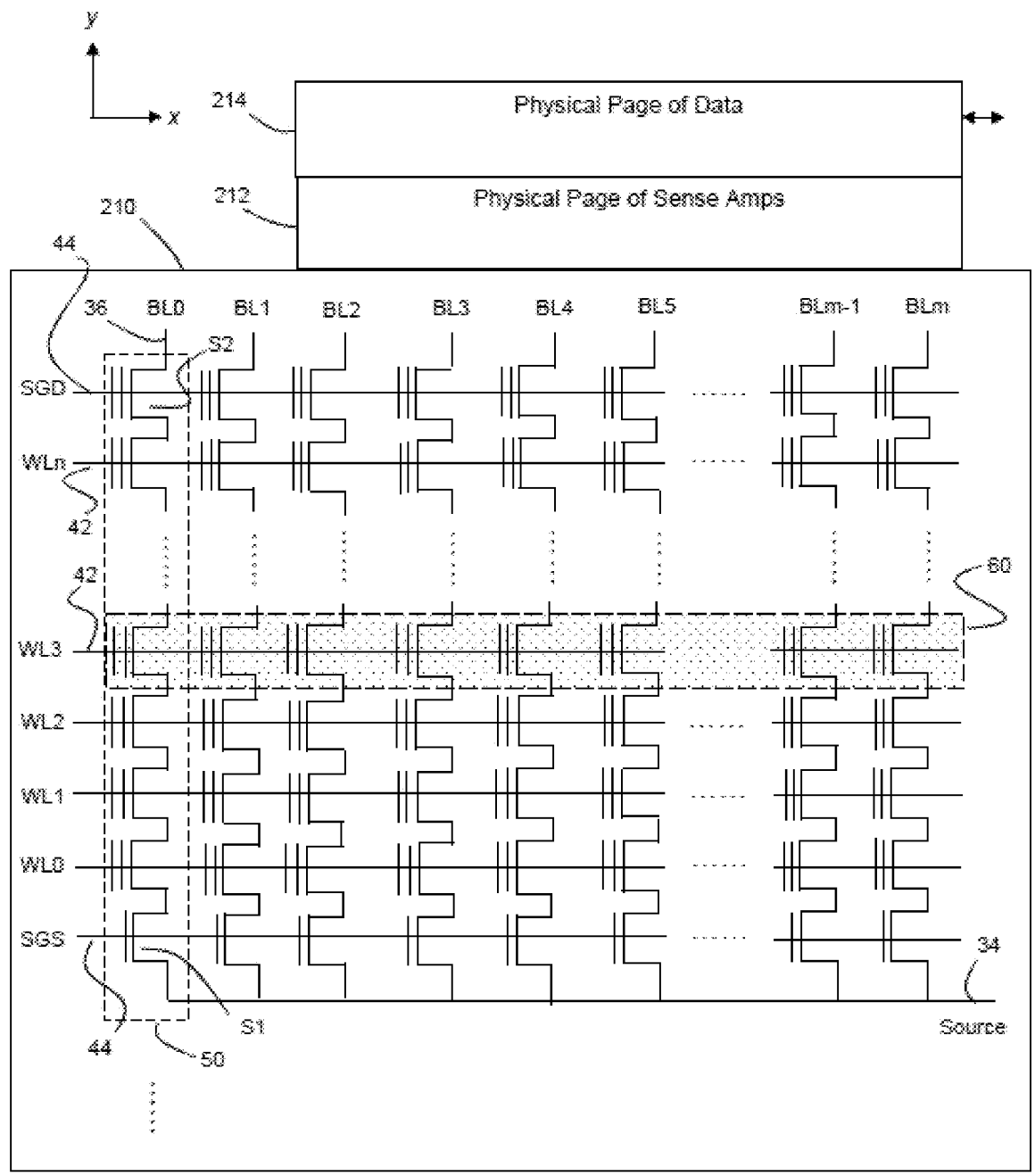
FIG. 5 depicts a page of memory cells being sensed or programmed in parallel, and in relation to a memory array organized in the NAND-type configuration, in accordance with exemplary embodiments.

Turning now to FIG. 5, there is depicted a detailed illustration of one bank of NAND strings 50 of a memory array 210 according to an exemplary embodiment thereof. This view is particularly useful in visualizing a row-by-row configuration of the memory array 210, wherein each row of the array 210 may be referred to as a "page." Accordingly, a physical page (such as page 60 denoted in FIG. 5) is a group of memory cells 10 that is enabled to be sensed or programmed in parallel. In fact, a page is the smallest unit of the memory device that may be programmed or written to. Programming of a page is accomplished by a corresponding page of sense amplifiers 212, wherein each sense amplifier may be coupled to a respective NAND string 50 via a bit line (e.g., see respective bit lines BL0, BL1, BL2, BL3, BL4, BL5, . . . , BLm−1, and BLm illustrated in FIG. 5). Thus, a page 60 is enabled by the control gates of the plurality of memory cells 10 in page 60, which are connected to a common word line 42, and each memory cell 10 of the page 60 is accessible by a sense amplifier via a bit line 36. Therefore, when programming or sensing a page 60 of memory cells 10, a programming or sensing voltage is respectively applied to the common word line (e.g., word line WL3 with respect to the page 60) together with appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page. For example, in a memory device of the SLC-type in which one bit of data is stored in each memory cell 10, one physical page 60 stores one logical page of data. Accordingly, in a memory device of the MLC-type in which two bits of data are stored in each memory cell 10, one physical page 60 can store two logical pages of data. As such, one or more logical pages of data are typically stored in one row (i.e., page 60) of memory cells. A page 60 can store one or more sectors wherein a sector is comprised of both user data and overhead data. In an exemplary embodiment, individual pages 60 may be divided into segments in which each segment contains the fewest number of memory cells 10 that may be written at one time in a basic programming operation.

Figure 6:
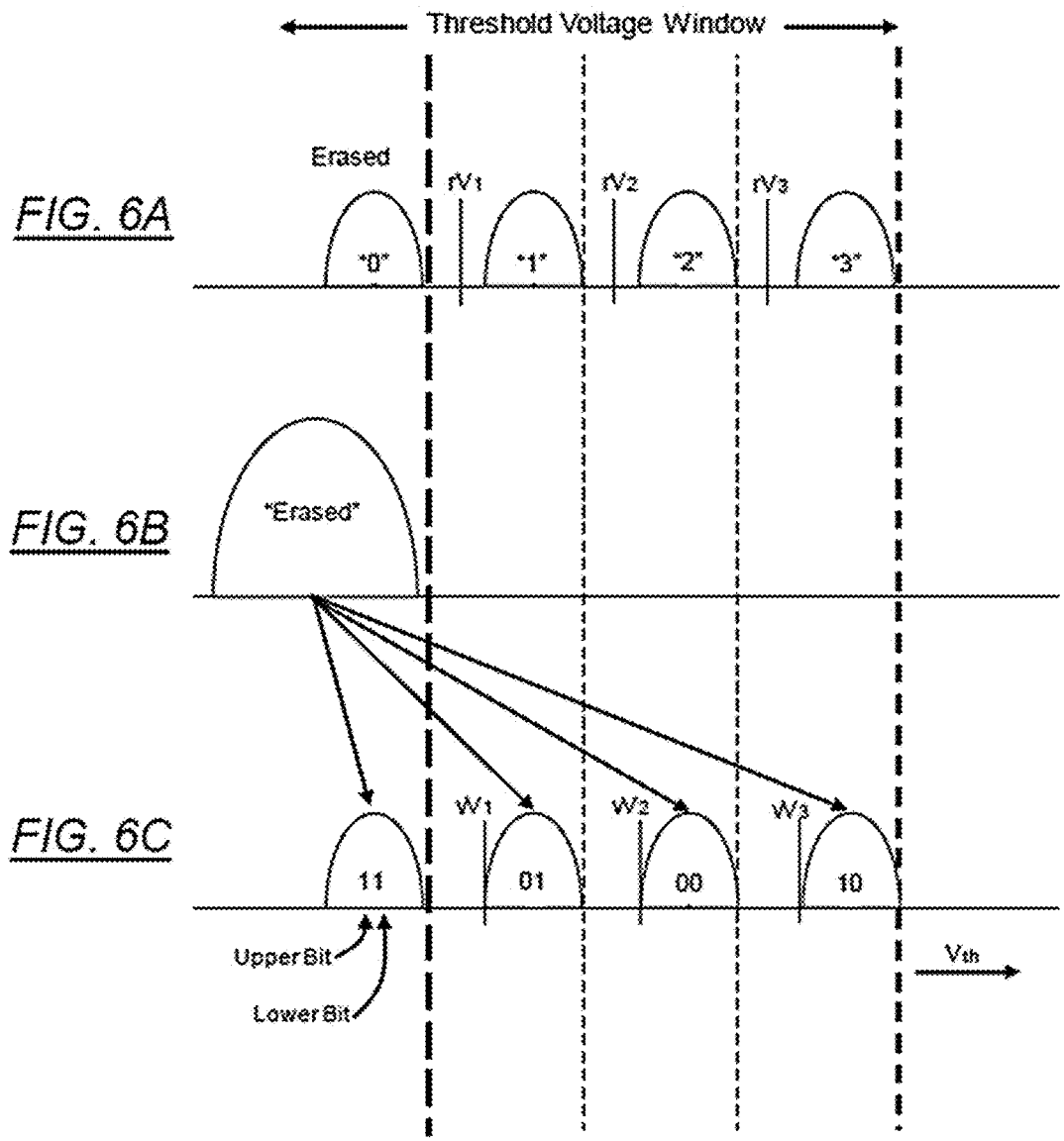
FIGS. 6A-6C depict stages of programming four states of a population of MLC NAND-type memory cells, in accordance with exemplary embodiments.

To illustrate an exemplary embodiment of the programming stages of a MLC-type memory device comprising a population of four-state memory cells, reference is made to FIGS. 6A-6C. In FIG. 6A, there is depicted a population of memory cells in which the characteristic threshold voltage window is divided into four distinct voltage distributions wherein each distribution corresponds to a programmable memory state (i.e., memory states "0," "1," "2," and "3"). FIG. 6B illustrates an initial distribution of "erased" threshold voltages for an erased memory. In FIG. 6C, much of the memory cell population is programmed such that the initial "erased" threshold voltage of a given memory cell 10 is moved to a higher value into one of the three divided voltage zones demarcated by verify levels $vV_1$, $vV_2$, and $vV_3$. Accordingly, each memory cell can be programmed to one of the three programmable states "1," "2," and "3," or remain in the "erased" state. On a bit level, a 2-bit code having a lower bit and an upper bit can be used to represent each of the four memory states. For example, as depicted in FIG. 6C, the memory states "0," "1," "2," and "3" may be assigned bit values "11," "01," "00," and "10" respectively.

In such an example, the 2-bit data may be read from the memory by sensing in a "full-sequence" mode where the two bits are sensed together by sensing relative to the corresponding read demarcation threshold voltages $rV_1$, $rV_2$, and $rV_3$ in three sub-passes respectively.

Figure 7:
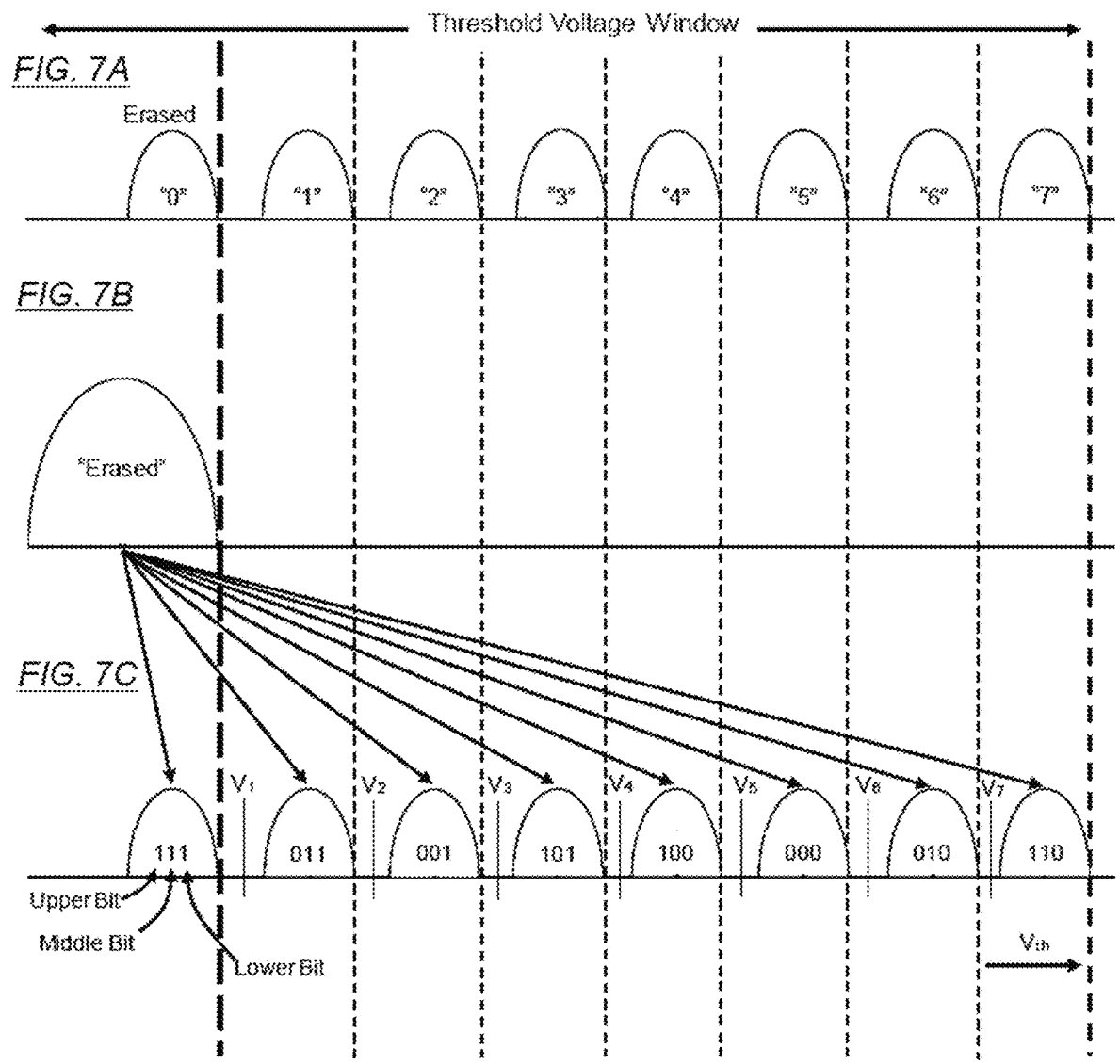
FIGS. 7A-7C depict stages of programming eight states of a population of TLC NAND-type memory cells, in accordance with exemplary embodiments.

Similarly, FIGS. 7A-7C illustrate programming stages of a TLC-type memory device comprising a population of eight-state memory cells, each cell being programmable into eight distinct distributions of threshold voltages that, in accordance with this particular embodiment, represent memory states "0," "1," "2," "3," "4," "5," "6," and "7," respectively (as shown in FIG. 7A). Thus, FIG. 7B depicts an initial distribution of "erased" threshold voltages for an erased memory. Further, FIG. 7C depicts an example of the memory after many of the memory cells have been programmed. As a result, a cell's threshold voltage is moved higher into one of the distinct voltage ranges demarcated by levels $V_1$, $V_2$, $V_3$, $V_4$, $V_5$, $V_6$, and $V_7$. Accordingly, each memory cell can be programmed to one of the seven programmed states "1" through "7," or can remain unprogrammed in the "erased" state. As a consequence of the programming, the initial distribution of the "erased" state as shown in FIG. 7B becomes narrower as indicated by the "0" state in FIG. 7C. In this case, a 3-bit code having lower, middle, and upper bits can be used to represent each of the memory states (i.e., "111," "011," "001," "101," "100," "000," "010," and "110") and the 3-bit data may also be read from the memory by sensing in the "full-sequence" mode where the three bits are sensed together by sensing relative to the demarcation threshold values $V_1$ through $V_7$ in seven sub-passes respectively.

Continuing in a similar manner, FIGS. 8A-8C illustrate the programming stages of a QLC-type memory device comprising a population of 16-state memory cells, each cell being programmable into 16 distinct distributions of threshold voltages that, in accordance with this particular embodiment, represent memory states "0," "1," "2," "3," "4," "5," "6," "7," "8," "9," "10," "11," "12," "13," "14," and "15," respectively (as shown in FIG. 8A). Accordingly, FIG. 8B depicts an initial distribution of "erased" threshold voltages for an erased memory; whereas FIG. 8C depicts an example of the memory after programming. As depicted, a cell's threshold voltage is moved higher into one of the distinct voltage ranges, as demarcated by levels $V_1$, $V_2$, $V_3$, $V_4$, $V_5$, $V_6$, $V_7$, $V_8$, $V_9$, $V_{10}$, $V_{11}$, $V_{12}$, $V_{13}$, $V_{14}$, and Vis. Therefore, each memory cell can be programmed to one of 15 programmed states "1" through "15," or can remain unprogrammed in the "erased" state. Again, as a consequence of the programming, the initial distribution of the "erased" state as shown in FIG. 8B becomes narrower as indicated by the "0" state in FIG. 8C. Thus, according to this particular distribution, a 4-bit code having lower, middle, upper and top bits can be used to represent each of the memory states (i.e., "1111," "1110," "1100," "1101," "0101," "0100," "0000," "0010," "0110," "0111," "0011," "0001," "1001," "1011," "1010," and "1000").

Figure 9:
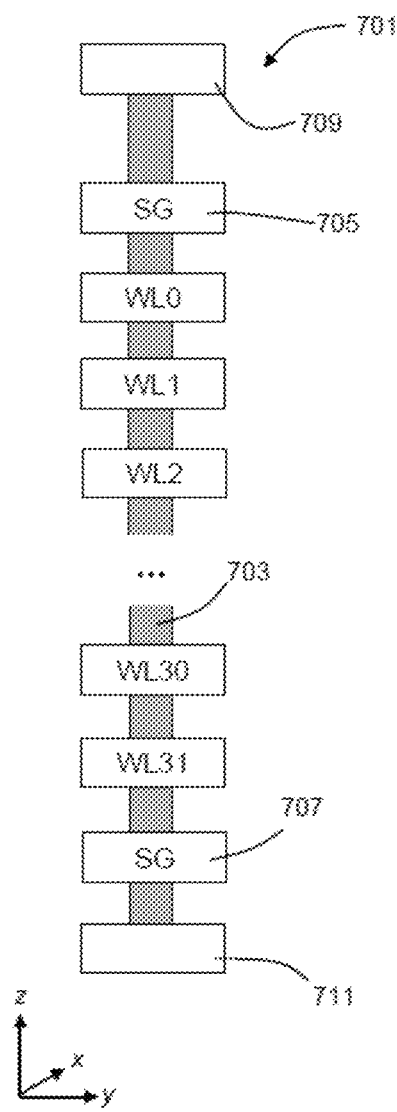
FIG. 9 depicts a vertical NAND-type string in accordance with an exemplary embodiment.

In FIGS. 4A-4B and 5 and the foregoing corresponding discussion, there is generally described a two-dimensional (or planar) memory array 210 (lying in a x-y plane, for example), which may comprise NAND-type memory cells. However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a z direction that is perpendicular to the x-y plane). For example, in FIG. 9 there is depicted an exemplary embodiment of a NAND-type string 701, which is operated in a similar manner as a planar two-dimensional NAND-type string (such as the NAND-type string 50 described above). In this configuration, a memory cell is formed at the juncture of a vertical bit line (see e.g., local bit line 703) and a word line (see e.g., word lines WL0, WL1, etc.), wherein a charge trapping layer located between the local bit line 703 and an intersecting word line stores charge (which dictates the threshold voltage of the transistor formed by the word line—gate—coupled to the vertical bit line—channel—that it encircles). To form such a vertical string 701, stacks of word lines are formed and memory holes are etched at the appropriate locations where cells are to be formed, wherein each memory hole is lined with a charge trapping layer and filled with a suitable local bit line/channel material. Dielectric layers are included for the necessary isolation. Further, located at either end of the NAND-type string 701 are select gates 705, 707, which allow for the selective connection to, or isolation from, external elements 709, 711 that include, for example, conductive lines such as common source lines or bit lines that serve large numbers of strings 701 of an array. In the particular embodiment shown in FIG. 9, the vertical NAND-type string 701 has 32 memory cells (i.e., at the juncture between local bit line 703 and word lines 0 through 31) connected in series. However, a NAND-type string 701 may comprise any suitable number of memory cells.

As described above, memory cells of the memory structure 200 may be arranged in a single memory device level in an ordered two-dimensional array of a plurality of rows and/or columns. Alternatively, a three-dimensional memory array may be arranged such that memory cells occupy multiple planes or multiple memory device levels, thereby forming a structure that has three dimensions (e.g., in the x, y, and z directions, wherein the z direction is substantially perpendicular and the x and y directions are substantially parallel to the major surface of the semiconductor substrate). In some exemplary embodiments, a three-dimensional memory structure 200 may be vertically arranged as a stack of multiple two-dimensional memory array device levels. In other exemplary embodiments, the three-dimensional memory structure 200 is arranged as multiple vertical columns (wherein each column extends substantially perpendicular to the major surface of the substrate, i.e., in the z direction) with each column having multiple memory cells. In this example, the vertical columns may be arranged in a two-dimensional configuration (i.e., in the x-y plane), thereby forming a three-dimensional arrangement in which the memory cells are on multiple vertically stacked memory planes. Other configurations of memory elements in three dimensions can also constitute a three-dimensional memory array. However, generally speaking, a three-dimensional NAND array may be constructed by tilting a two-dimensional memory structure, such as structures 50 and 210 of FIGS. 4A-B and 5, respectively, in the vertical direction that is perpendicular to the x-y plane (i.e., the z direction), such that each y-z plane of the three-dimensional structure corresponds to the page structure of FIG. 5, wherein each plane is at differing locations along the x axis. As a result, the global bit lines (e.g., BL0, BLm, of FIG. 5) each run across the top of the memory structure to an associated sense amplifier (e.g., SA0, . . . , SAm). Accordingly, the word lines (e.g., WL0, . . . , WLn, of FIG. 5), and the source and select lines (e.g., SSL0, . . . , SSLn, and DSL0, . . . , DSLn, respectively) extend in the x direction, with the bottom of each NAND string (e.g., string 50) connected to a common source line.

Figure 8:
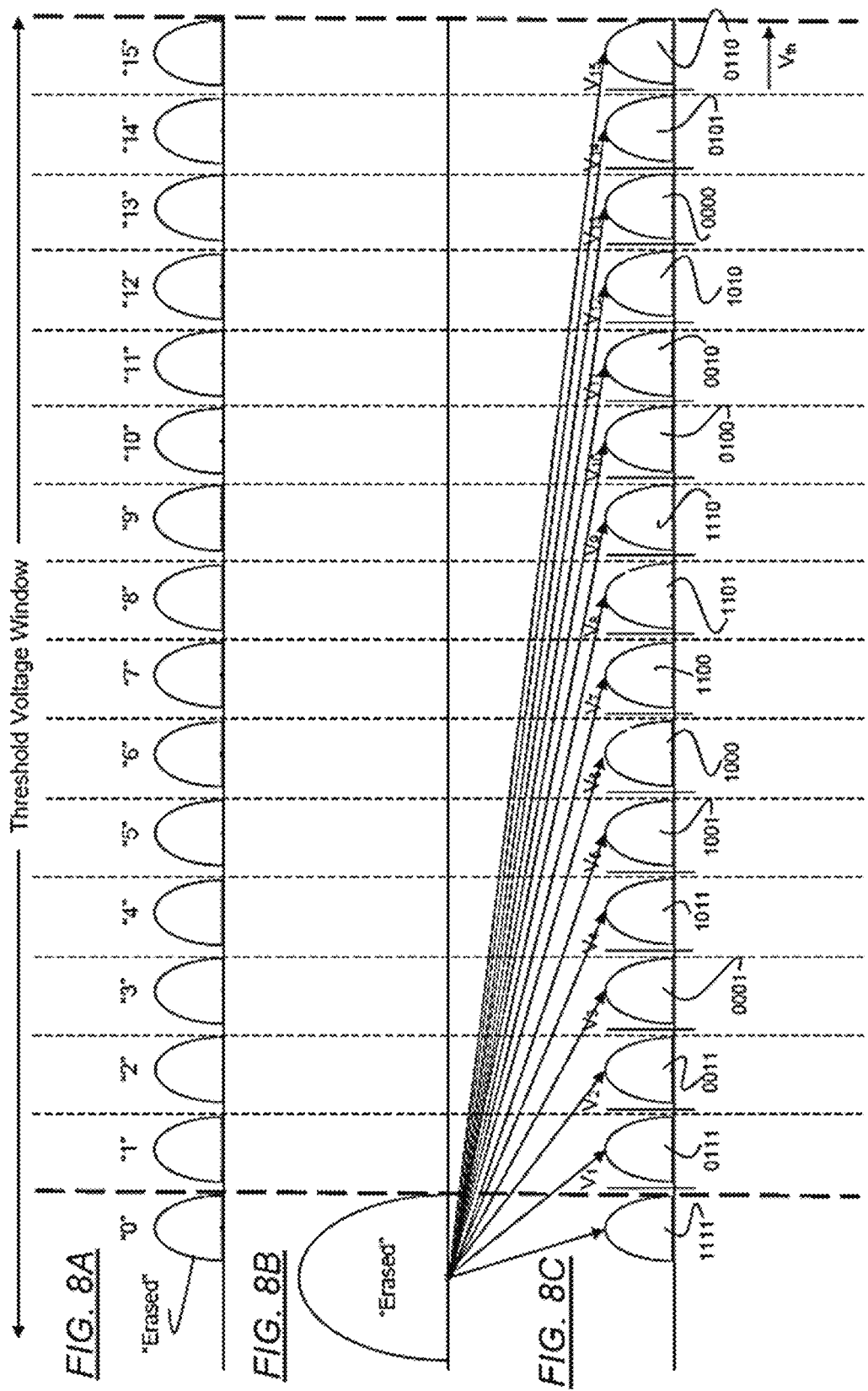
FIGS. 8A-8C depict stages of programming 16 states of a population of QLC NAND-type memory cells, in accordance with exemplary embodiments.
Figure 10:
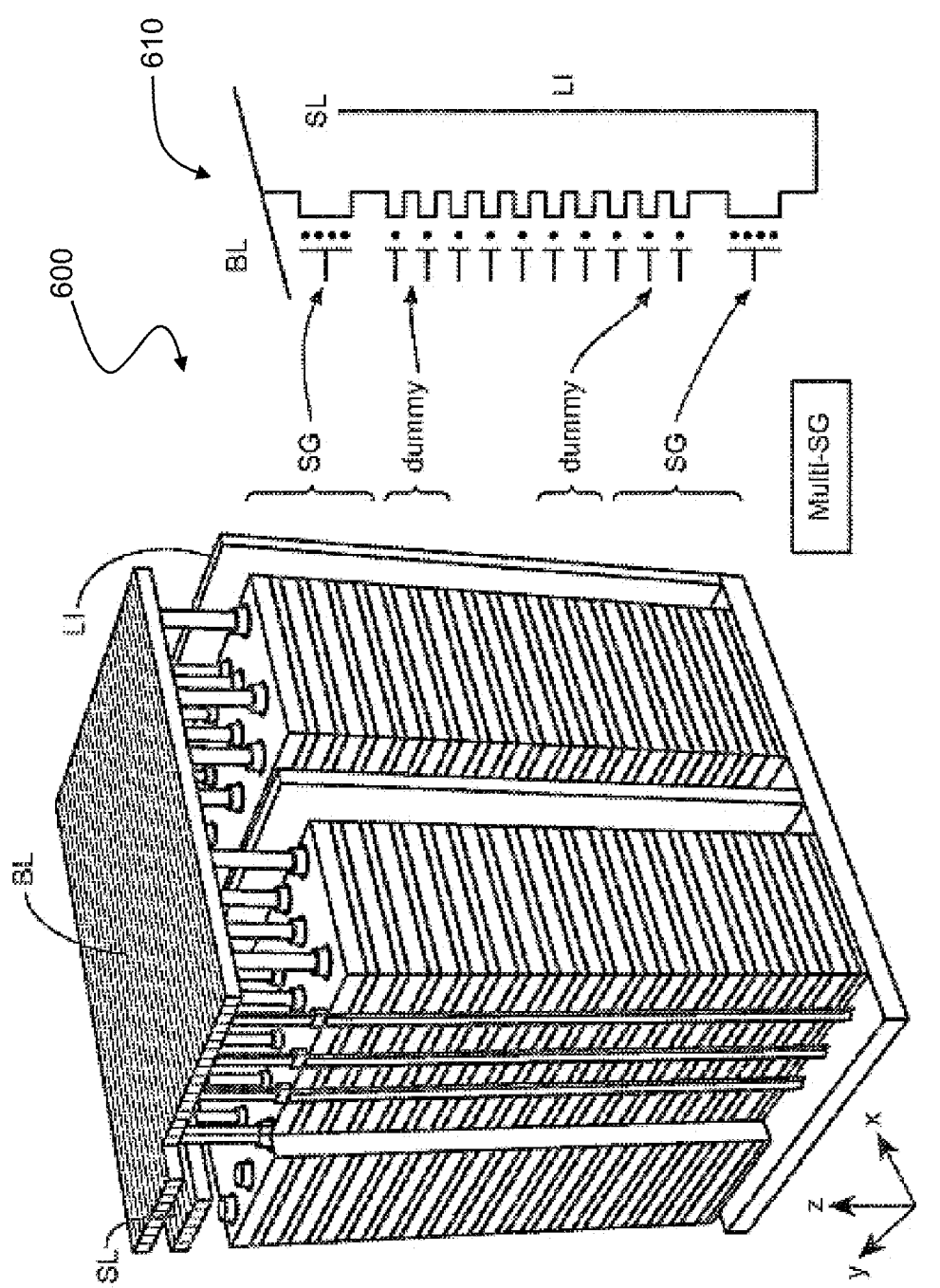
FIG. 10 is a perspective view of a representative subsection of a monolithic three-dimensional NAND-type memory array, in accordance with exemplary embodiments.

Referring now to FIG. 10, there is depicted an oblique perspective view of an example subsection of an embodiment of a three-dimensional NAND memory array 600 of the Bit Cost Scalable ("BiCS") type in which one or more memory device levels is formed above a single substrate. The example subsection corresponds to two of the page structures shown in FIG. 4B wherein, depending upon the particular embodiment, each may correspond to a separate memory block or may be different extensions of the same block. According to this embodiment, rather than lying in the same y-z plane, the NAND strings are pressed in the y-direction such that the NAND strings have a staggered configuration in the x-direction. Further, at the top of the array 600, the NAND strings are connected along global bit lines (BL) that span multiple of these subsections of the array 600 that run in the x-direction. In addition, global common source lines (SL) also run across multiple subsections of the memory array 600 in the x-direction and are connected to the sources at the bottom of the NAND strings by a local interconnect (LI) that operates as the local common source line of the individual extension. However, dependent upon the embodiment, the global source lines (SL) can span the whole, or just a subsection, of the memory array 600. Depicted on the right side of FIG. 8 is a schematic representation of the fundamental elements of one of the vertical NAND strings 610 of the memory array 600. Similar to the NAND string 50 of FIG. 4A, the string 610 is comprised of a series of interconnected memory cells. The string 610 is connected to an associated bit line (BL) through a drain select gate (SGD). A source select gate (SDS) connects the string 610 to a global source line (SL) through an associated local source line (LI). Further included in this particular embodiment are several dummy cells located at the ends of the string 610. Due to their proximity to select gates (SGD, SDS) and, thereby, their susceptibility to disturbs, the dummy cells are not used to store user data.

Figure 11:
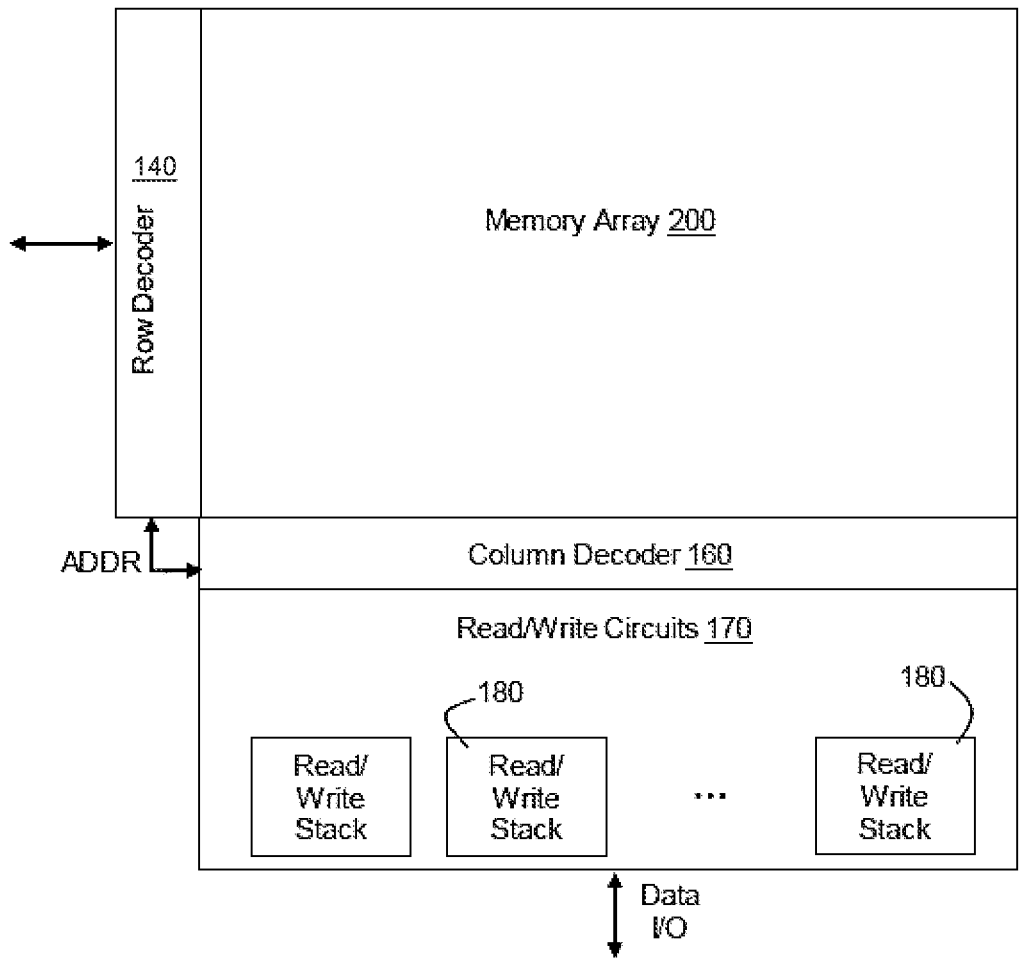
FIG. 11 is a schematic depiction of a configuration of a non-volatile memory array that is accessible by read/write circuits via row and column decoders, in accordance with exemplary embodiments.
Figure 12:
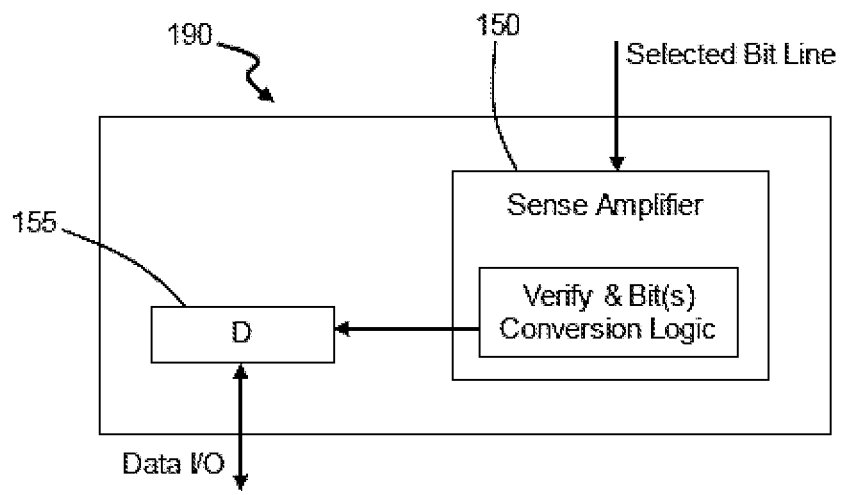
FIG. 12 is a block diagram of an individual read/write module, in accordance with an exemplary embodiment.

Referring back to the overall architecture of a memory system that is, for example, depicted in FIG. 1, a schematic depiction of a typical arrangement of a memory array of such a system is illustrated in FIG. 11. In this exemplary embodiment, there is shown a non-volatile memory array 200 that is accessible by read/write circuits 170 by way of row decoder 140 and column decoder 160. As previously described above, individual memory cells of the memory array 200 are addressable via a set of selected word line(s) and bit line(s). Accordingly, the row decoder 140 selects one or more word lines and the column decoder 160 selects one or more bit lines in order to apply the appropriate voltages to the respective gates of the addressed memory cells. Further, read/write circuits 170 are provided to read or write the memory states of the addressed memory cells, wherein the read/write circuits 170 comprise a number of read/write modules connectable via bit lines to the memory elements of the array 200. A schematic block diagram of such a read/write module 190 is provided in FIG. 12, according to an exemplary embodiment thereof. In operation, during a read or verify step, a sense amplifier 150 determines the current that is flowing through the drain of an addressed memory cell that is connected via a selected bit line. The level detected by the sense amplifier 150 is converted by a level-to-bits conversion logic to a set of data bits to be stored in a data latch 155. Now referring back to FIG. 11, the read/write circuits 170 are organized into banks of read/write stacks 180 wherein each read/write stack 180 is a stack of read/write modules 190.

Figure 13A:
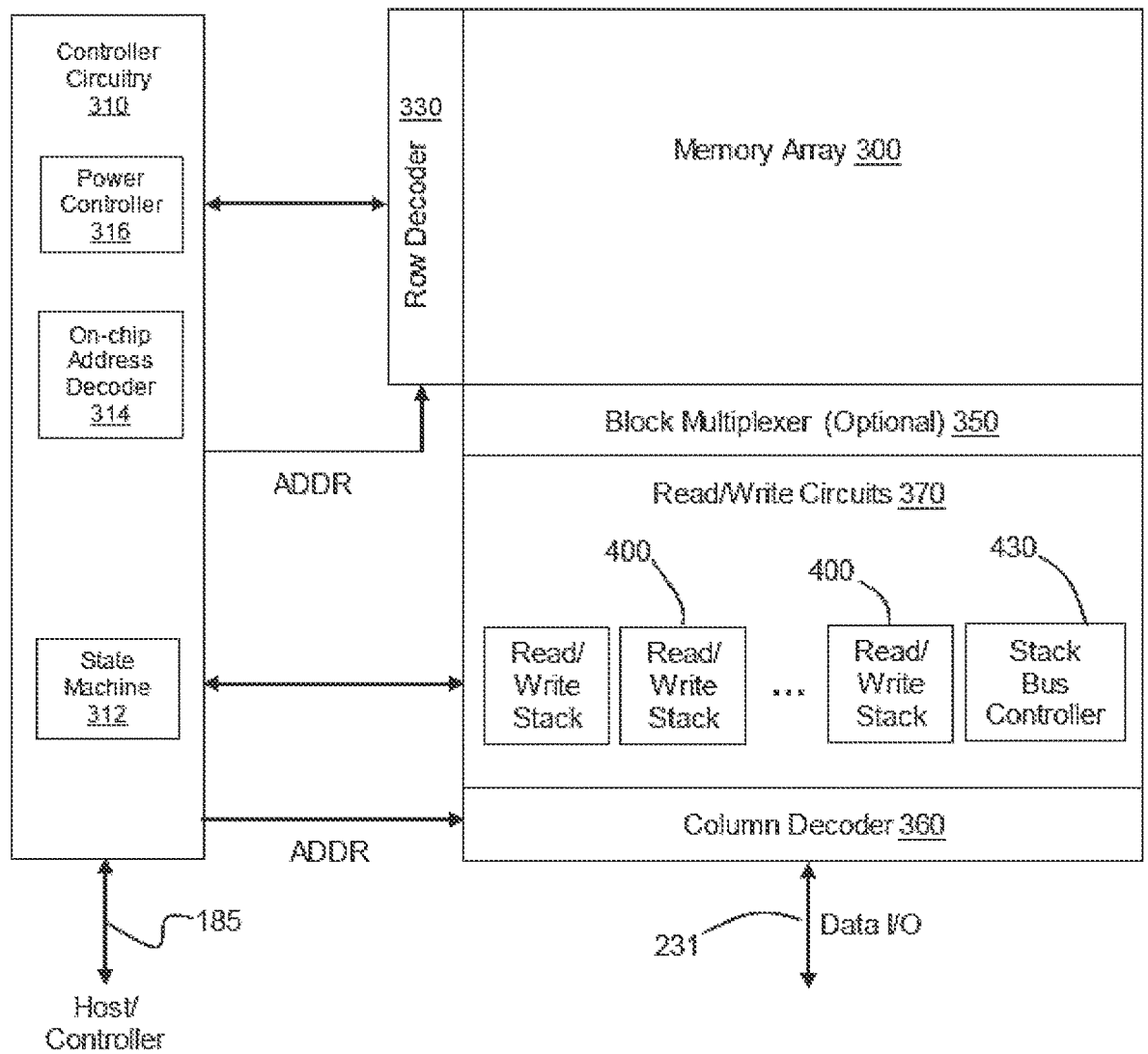
FIG. 13A is a schematic depiction of a memory device with a bank of partitioned read/write stacks, in accordance with exemplary embodiments.

Referring now to FIG. 13A, there is shown an exemplary embodiment of a memory device (such as memory device 102 in FIG. 1, for example) that is comprised of a non-volatile memory array 300 (which may include the NAND-type SLC, MLC, TLC, and/or QLC memory cells that are in a two- or three-dimensional configuration), control circuitry 310, and read/write circuits 370. Further, as is depicted, read/write circuits 370 are comprised of one or more banks of partitioned read/write stacks 400, thereby allowing a block (or "page") of memory cells to be read or programmed in parallel wherein, according to an exemplary embodiment, a "page" of memory cells constitutes a contiguous row of memory cells. Memory array 300 is addressable by word lines via row decoder 330 and by bit lines via column decoder 360. Alternatively, the memory array 300 may comprise rows of memory cells partitioned into multiple blocks or pages. Hence, in such an exemplary embodiment, a block multiplexer 350 is provided to multiplex the read/write circuits 370 to the individual blocks.

With respect to the control circuitry 310, it operates in conjunction with the read/write circuits 370 to perform memory operations on the memory array 300. In this particular embodiment, the control circuitry 310 includes a state machine 312, an on-chip address decoder 314, and a power controller 316. The state machine 312 provides chip level control of memory operations. The on-chip decoder 314 provides an address interface between that that is used by the host or a memory controller to the hardware address used by the decoders 330, 360. Lastly, the power controller 316 controls the power and voltages that are supplied to the word lines and bit lines during memory operations.

Figure 13B:
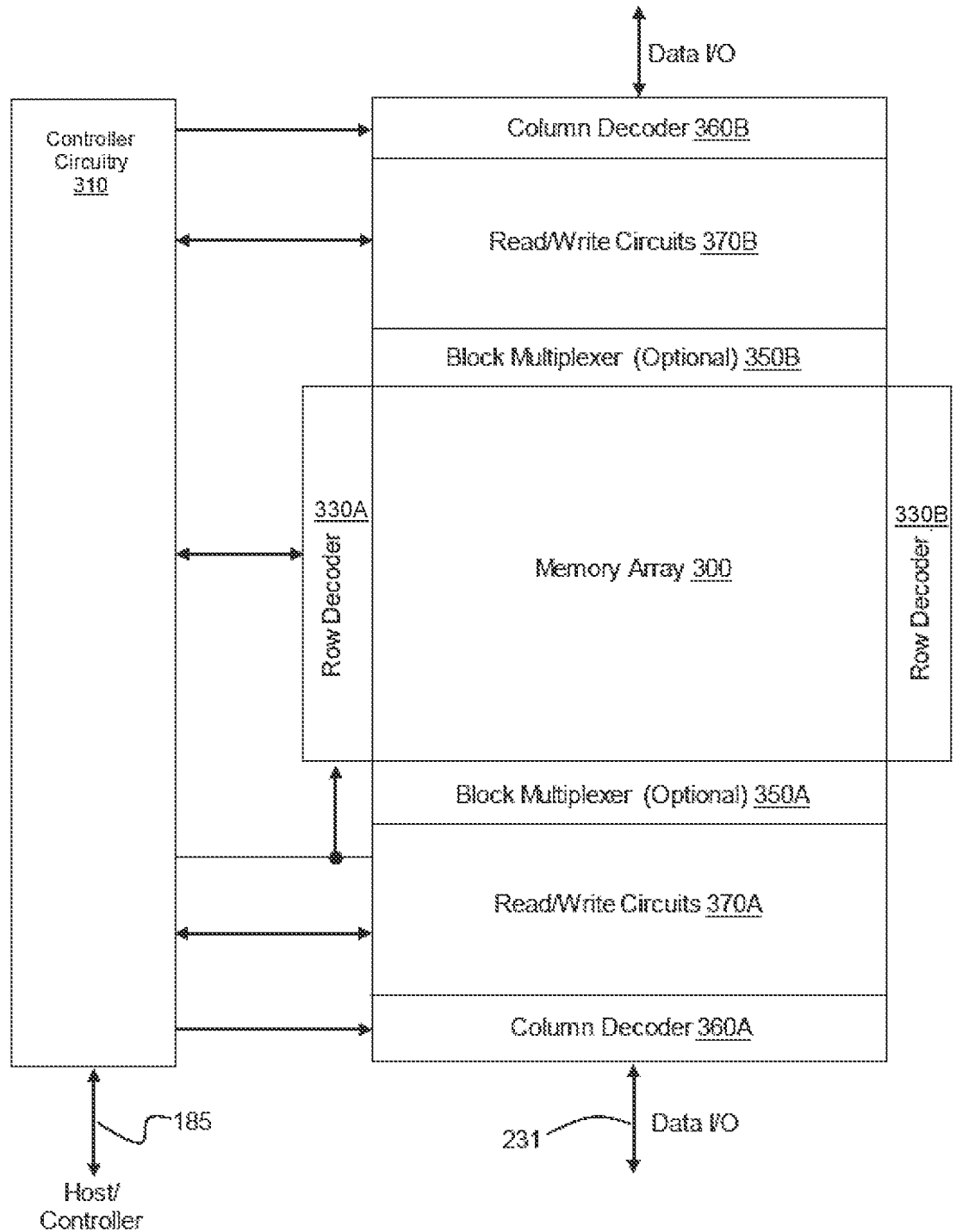
FIG. 13B is a schematic depiction of the memory device of FIG. 13A in a slightly different configuration, in accordance with exemplary embodiments.

FIG. 13B depicts a slightly different exemplary embodiment of the memory device of FIG. 13A. In this particular embodiment, access to memory array 300 by the various peripheral circuits is implemented in a symmetrical manner on opposite sides of the memory array 300. As a result, the access lines and circuitry on each side of the memory array 300 are reduced in half when compared to the configuration in FIG. 13A. Specifically, the row decoder 330 is split into multiple row decoders 330A, 330B, and the column decoder 360 is split into multiple column decoders 360A, 360B. Furthermore, in such an embodiment in which a row of memory cells is partitioned into multiple blocks, block multiplexer 350 is split into multiple block multiplexers 350A, 350B. The read/write circuits 370 are likewise divided into read/write circuits 370A (connecting to bit lines from the bottom of memory array 300) and read/write circuits 370B (connecting to bit lines from the top of memory array 300). Accordingly, the density of the read/write modules (as well as the partitioned read/write stacks 400) is, in essence, reduced by half.

Figure 14:
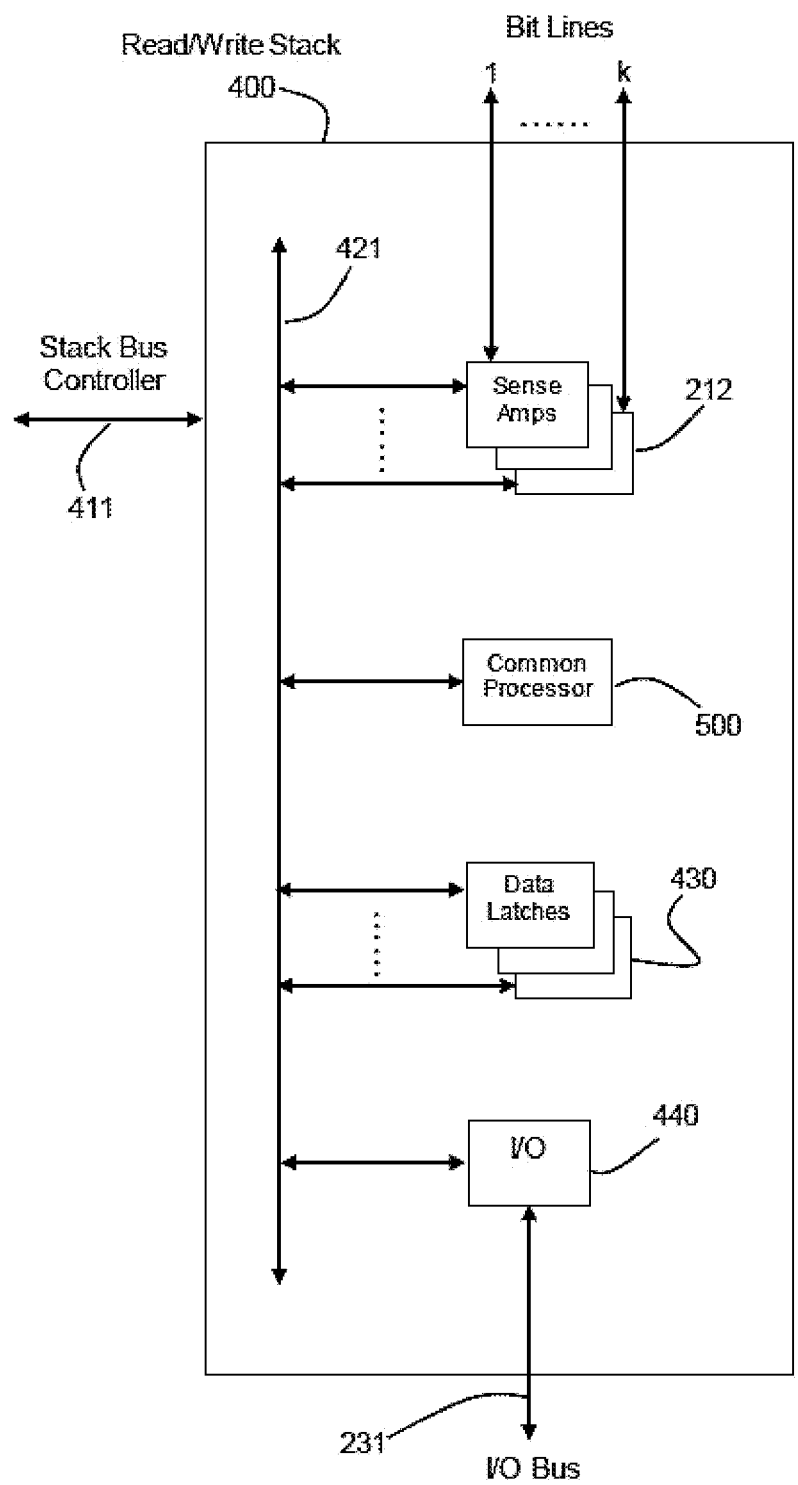
FIG. 14 is a schematic depiction of various components of a read/write stack, such as the read/write stacks depicted in FIG. 13A, in accordance with exemplary embodiments.
Figure 15A:
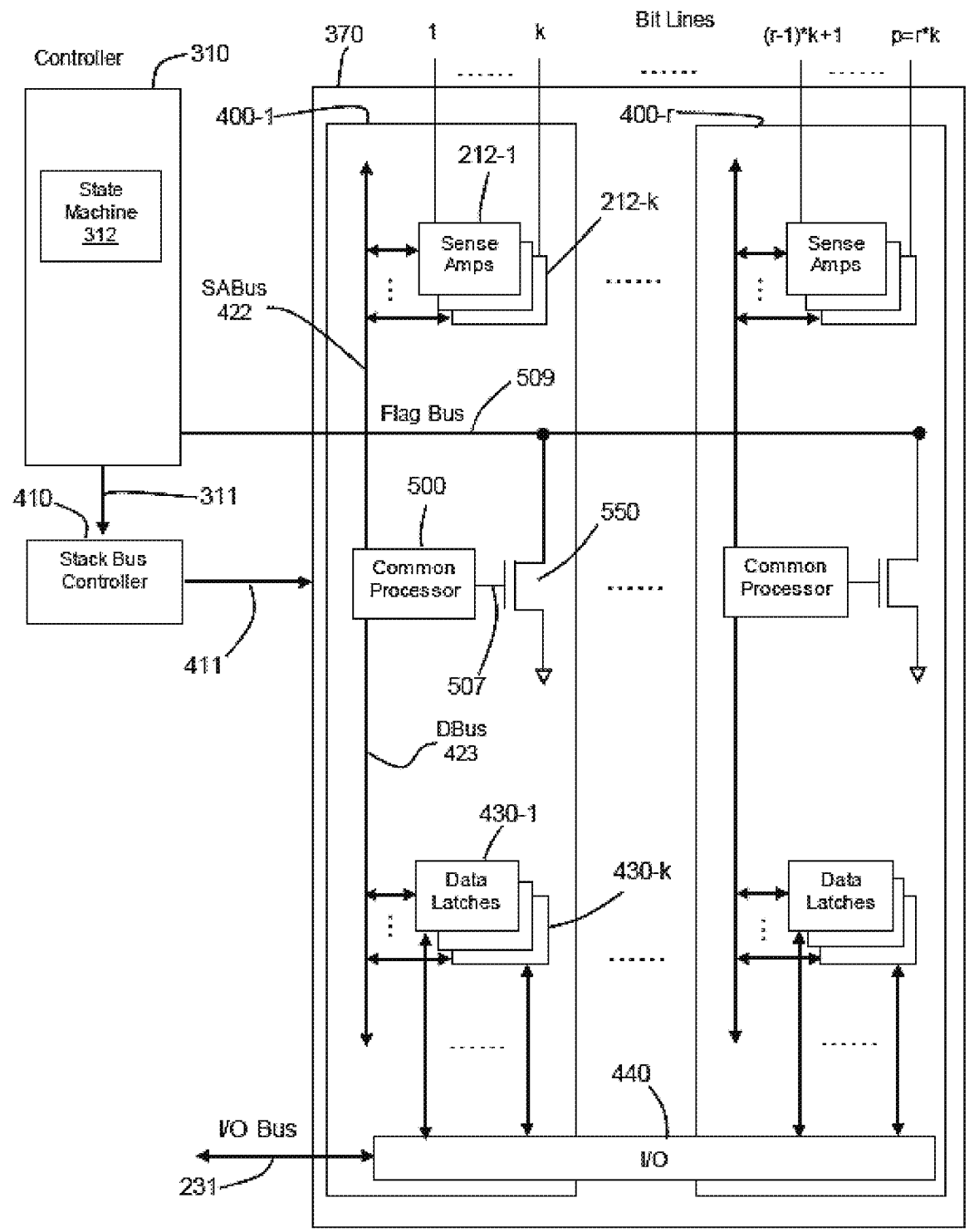
FIG. 15A is a schematic depiction of a plurality of read/write stacks arranged amongst read/write circuits of a memory device, such as the memory device depicted in FIG. 13A, in accordance with exemplary embodiments.

Referring now to FIG. 14, there is illustrated an exemplary embodiment of certain components in a read/write stack, such as the read/write stacks 400 of FIG. 13A. According to this particular architecture, a read/write stack 400 comprises a stack of sense amplifiers 212 for sensing a "k" number of bit lines, an I/O module 440 for input or output of data over an I/O bus 231, a stack of data latches 430 for storing input and/or output data, a common processor 500 to process and store data among the read/write stack 400, and a stack bus 421 for communication among the read/write stack 400 components. In addition, a stack bus controller provides control and timing signals via lines 411 for controlling the various components of read/write stack 400. FIG. 15A depicts an exemplary embodiment for incorporating the read/write stack 400 of the embodiment of FIG. 14 amongst the read/write circuits 370 of the memory devices depicted in FIGS. 13A-13B. As indicated above, each of read/write stacks 400 operates on a group of "k" number bit lines in parallel. Therefore, if a page in memory array 300 has p=r*k bit lines, there will be a "r" number of read/write stacks—i.e., read/write stacks 400-1, . . . , 400-r. Accordingly, the entire bank of partitioned read/write stacks 400-1, . . . , 400-r, operating in parallel allows a block (or a page) of p cells along a row to be read or programmed in parallel, there being p read/write modules for the entire row of cells. As each read/write stack 400-1, . . . , 400-r serves "k" memory cells, the total number of read/write stacks in a bank may be expressed as r=p/k. Further, in accordance with this example, each read/write stack correspondingly has a stack of sense amplifiers 212-1, . . . , 212-k that serves a segment of "k" memory cells in parallel. In addition, each read/write stack correspondingly has a stack of data latches 430-1, . . . , 430-k, wherein each data latch is associated with a memory cell. As such, there is an I/O module 440 enabling data latches 430-1, . . . , 430-k to exchange data externally via an I/O bus 231.

Still referring to FIG. 15A, there is also shown a stack bus controller 410 that receives signals from the memory controller 310 (via lines 311) and in turn provides control and timing signals to the read/write circuits 370 via lines 411. Communication among the read/write stacks 400 is implemented by an interconnecting stack bus controlled by stack bus controller 410. Therefore, the control lines 411 provide control and clock signals from the stack bus controller 410 to the components of the read/write stacks 400-1, . . . , 400-r. In this particular example, the interconnecting stack bus is divided into a SABus 422 and a DBus 423, wherein SABus 422 provides for communication between the common processor 500 and the stack sense amplifiers 212-1, . . . , 212-k, and the DBus 423 provides a communication pathway between the common processor 500 and the stack of data latches 430-1, . . . , 430-k. With respect to the common processor 500, it further comprises an output 507 for output of a status signal of a memory operation, such as an error condition. As is depicted in FIG. 15A, this status signal may, for example, be used to drive a gate of a n-transistor 550 that is tied to a Flag Bus 509 in a Wired-Or configuration, wherein the Flag Bus 509 is pre-charged by the controller 310 and is pulled down when a status signal is asserted by any of read/write stacks 400-1, . . . , 400-r.

Figure 15B:
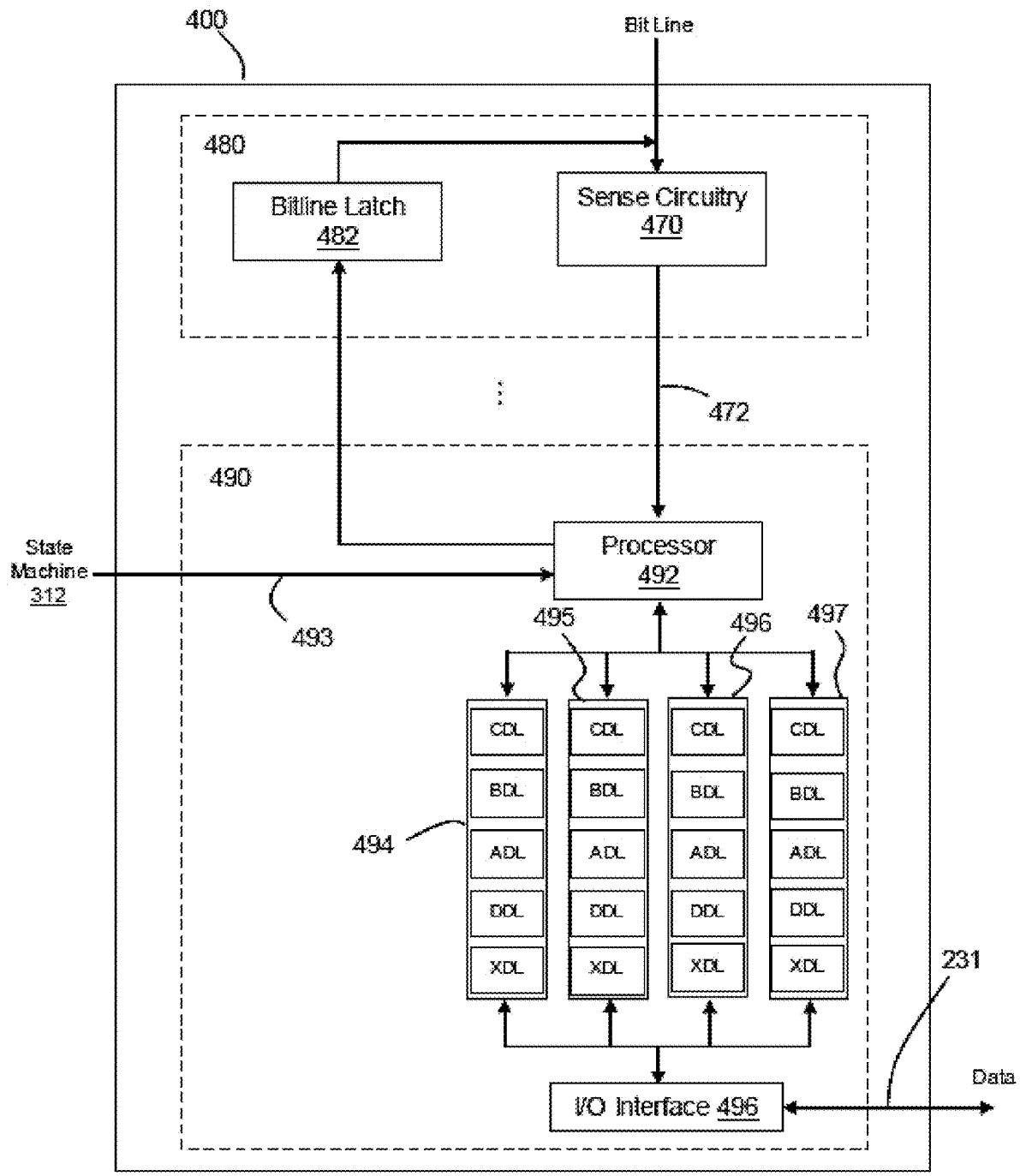
FIG. 15B is a block diagram depicting a sense block of a read/write stack, such as the read/write stacks depicted in FIG. 13A, in accordance with exemplary embodiments.

Further, an exemplary embodiment of an individual sense block (as encompassed by a read/write stack 400) is depicted in FIG. 15B. Sense block 400 is partitioned into one or more core portions comprising the sense modules 480 or sense amplifiers, and a common portion, referred to as a managing circuit 490. In one embodiment, there is a separate sense module 480 for each bit line and one common managing circuit 490 for a set of multiple, e.g., four or eight, sense modules 480. Each of the sense modules in a group communicates with the associated managing circuit via data bus 472. Thus, there are one or more managing circuits which communicate with the sense modules of a set of storage elements 10.

Sense module 480 comprises sense circuitry 470 that performs sensing by determining whether a conduction current in a connected bit line is above or below a predetermined threshold level. Sense module 480 also includes a bit line latch 482 that is used to set a voltage condition on the connected bit line. For example, a predetermined state latched in bit line latch 482 will result in the connected bit line being pulled to a state designating program inhibit (e.g., 1.5-3 V). As an example, a flag=0 can inhibit programming, while flag=1 does not inhibit programming.

In the exemplary embodiment of FIG. 15B, the managing circuit 490 comprises a processor 492, four example sets of data latches 494, 495, 496, and 497, and an I/O interface 496 coupled between the sets of data latches 494-497 and the data bus 231. One set of data latches may be provided for each sense module 480, and data latches identified by XDL, DDL, ADL, BDL, and CDL may be provided for each set. In some cases, additional data latches may be used. In one exemplary approach, in a memory device which uses eight data states, XDL stores user data, DDL stores an indication of whether quick pass write programming is used, ADL stores a lower page of data, BDL stores a middle page of data, and CDL stores an upper page of data.

Processor 492 performs computations, such as to determine the data stored in the sensed storage element and store the determined data in the set of data latches. Each set of data latches 494-497 is used to store data bits that are determined by processor 492 during a read operation, and to store data bits imported from the data bus 231 during a programming operation which represent write data that is meant to be programmed into the memory. The I/O interface 496 provides an interface between data latches 494-497 and the data bus 231.

During reading, the operation of the system is under the control of state machine 312 that controls the supply of different control gate voltages to the addressed storage element 10. As it steps through the various predefined control gate voltages corresponding to the various memory states supported by the memory, the sense module 480 may trip at one of these voltages and a corresponding output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494-497. In another embodiment of the managing circuit 490, the bit line latch 482 operates in a double duty capacity, both as a latch for latching the output of the sense module 480 and also as a bit line latch as described above.

During program or verify operations, the data to be programmed (write data) is stored in the set of data latches 494-497 from the data bus 231. The programming operation, under the control of the state machine 312, comprises a series of programming voltage pulses applied to the control gates of the addressed storage elements. Each program pulse is followed by a read back (verify) to determine if the storage element has been programmed to the desired memory state. In some cases, processor 492 monitors the read back memory state relative to the desired memory state. When the two are in agreement, the processor 492 proceeds to set the bit line latch 482 to cause the bit line to be pulled to a state designating program inhibit. This inhibits the storage element coupled to the bit line from further programming even if program pulses appear on its control gate. In other embodiments, the processor initially loads the bit line latch 482 and the sense circuitry sets it to an inhibit value during the verify process.

As mentioned, each set of data latches 494-497 may be implemented as a stack of data latches for each sense module. In one exemplary embodiment, there are three data latches per sense module 480. In some implementations, data latches are implemented according to a shift register so that the parallel data that is stored therein is converted to serial data for data bus 231, and vice versa. For example, all data latches corresponding to the read/write block of M storage elements can be linked together to form a block shift register so that a block of data can be input or output by serial transfer. In particular, the bank of read/write modules may be adapted in order that each of its set of data latches will shift data into or out of the data bus in sequence as if they are part of a shift register for the entire read/write block.

The data latches identify when an associated storage element 10 has reached certain mileposts in a programming operation. For example, latches may identify if a storage element's $V_{th}$ is below a particular verify level. Data latches indicate whether a storage element currently stores one or more bits from a page of data. For example, with respect to one exemplary embodiment, the ADL latch is flipped (e.g., from 0 to 1) when a lower page bit is stored in an associated storage element. Further, the BDL latch is flipped when a middle page bit is stored in an associated storage element. And the CDL latch is flipped when an upper page bit is stored in an associated storage element. A bit is stored in a storage element when the $V_{th}$ exceeds an associated verify level.

As mentioned above, although vast improvements have been made to increase the amount of efficient storage capability in high storage density memory structures (e.g., the BiCS type described above with respect to, for example, the exemplary embodiment depicted in FIG. 10), in many instances these advances in sheer capacity are nonetheless made without any compensatory enlargement to the die size of the memory structure in order to avoid creating a larger footprint. As a result, these improvements also bring about competing drawbacks and liabilities in the performance characteristics and behaviors of these memory structures. For example, as explained above, higher storage density memory structures (e.g., MLC, TLC, QLC type) may exhibit, for example, a marked increase in the amount of power consumption as a consequence of the increase in the number of discrete threshold voltage ($V_{th}$) ranges being programmed. Thus, various approaches may be employed to, for example reduce the power consumption in connection with the memory operations. The following discussion describes examples of such approaches, namely with respect to the efficient programming of MLC type memory cells.

Figure 16:
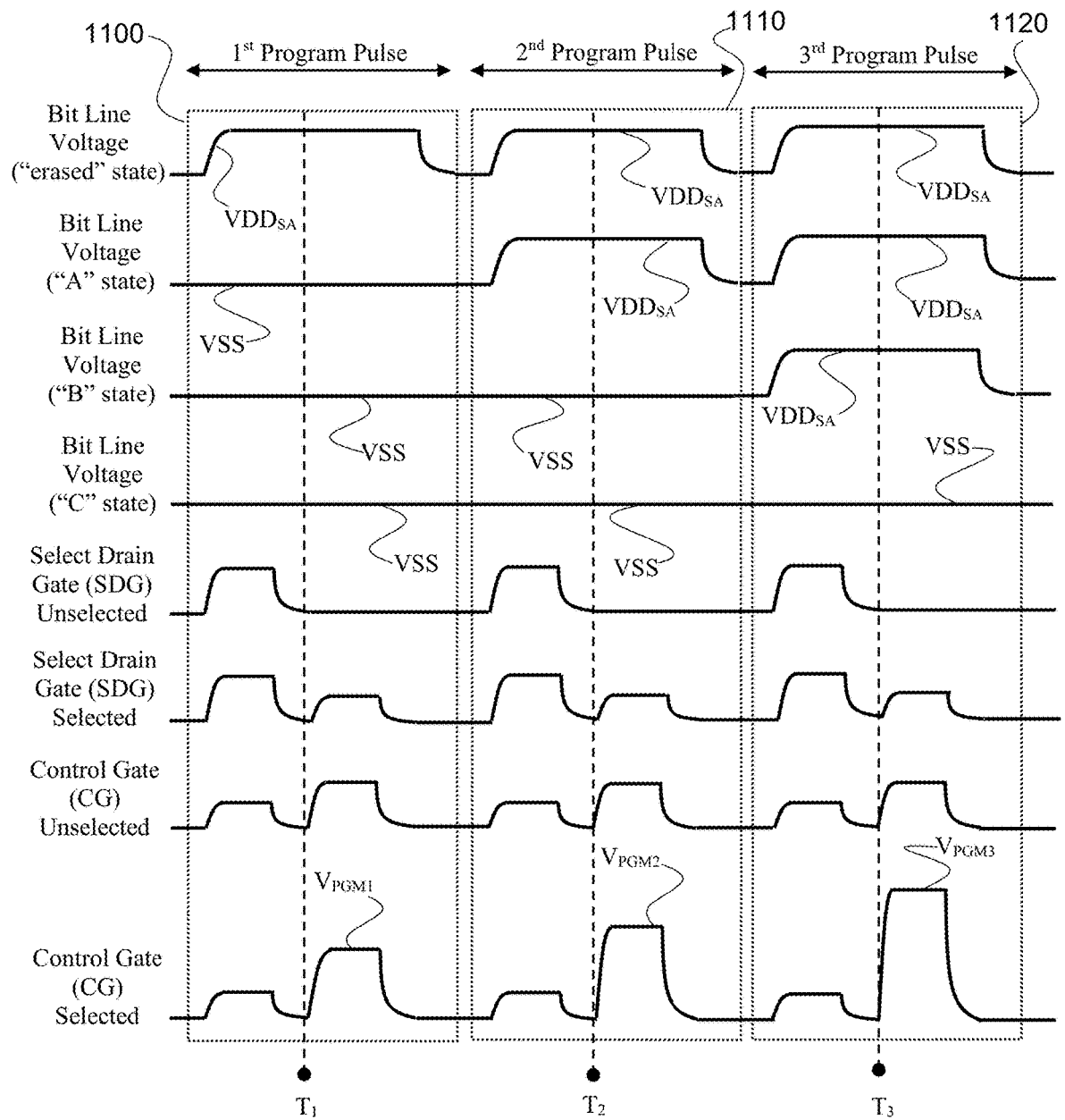
FIG. 16 is a signal waveform or signal timing diagram that generally depicts a programming operation with respect to a population of MLC NAND-type memory cells, in accordance with an exemplary embodiment.
Figure 17:
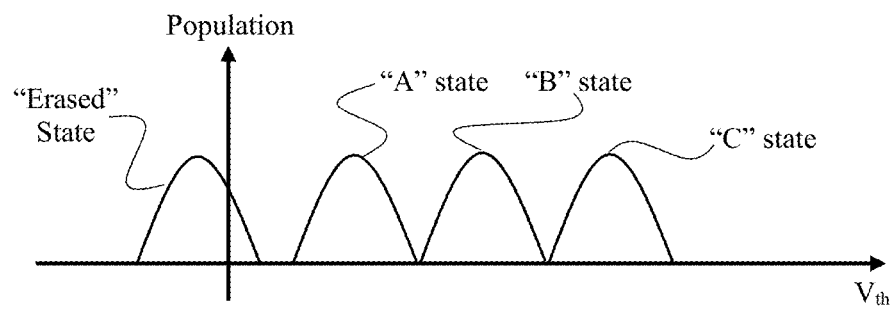
FIG. 17 generally depicts a programming operation of three programmable states of a population of MLC NAND-type memory cells, in accordance with exemplary embodiments.

By way of background, FIG. 16 provides a general depiction of a signal waveform or signal timing diagram of an exemplary embodiment of a programming operation as applied to a population of MLC type memory cells, such as the memory cell population that is illustrated generally in FIG. 17. As described in detail above (e.g., with respect to FIGS. 6A-6C), and according to certain exemplary embodiments, a programming operation that is applied to a population of MLC type memory cells will ideally result in the programming of three programmable states. Thus, as shown in FIG. 17, a threshold voltage ($V_{th}$) distribution of a population of MLC type memory cells is divided into three programmable states, which are referenced herein as programmable states "A," "B," and "C." Correspondingly, the signal waveform or timing diagram set forth in FIG. 16 indicates the various voltages that are applied during each of three program pulses (1100, 1110, and 1120) that, according to this specific embodiment, are needed to efficiently program three programmable states, i.e., states "A," "B," and "C." Therefore, in a first program pulse (1100), a "pre-charge" bit line voltage ($VDD_{SA}$) is applied to the memory structure, thereby generating an "inhibit" condition at an "erased" state such that the threshold voltage ($V_{th}$) distribution of selected memory cells may shift to a programmable state. Further, as indicated in FIG. 16, this "precharge" bit line voltage ($VDD_{SA}$) is applied during each program pulse 1100, 1110, and 1120, as is required to effectuate the programming.

Also during the first program pulse 1100, a "zero voltage" condition (i.e., in which applicable bit line(s) are connected to "ground", or VSS, wherein VSS=0 volts) is then applied to one or more selected (or addressed) bit lines of the memory structure. Additionally, at a first point in time ($T_1$), an appropriate initial programming voltage ($V_{PGM1}$) is further applied to the control gate(s) of one or more selected memory cell(s) of the memory structure via one or more corresponding selected (or addressed) word line(s) of the memory structure. As a result of the initial programming voltage ($V_{PGM1}$) applied to the control gate(s), a voltage differential is generated, wherein this voltage differential is equal to the difference between the initial programming voltage ($V_{PGM1}$) and the "zero voltage" condition (VSS) present at the channel region. Accordingly, this voltage differential results in a shift of the threshold voltage ($V_{th}$) distribution of the selected memory cell(s) into a first programmed state which, in this specific example, is referenced as the "A" state.

Next, as illustrated in FIG. 16, in order to program a selected population of memory cell(s) to a second programmed state (referenced as the "B" state in this particular example), a second program pulse 1110 commences. Further, to complete the programming of the first programmable state (or "A" state according to this particular example) and to ensure that the threshold voltage ($V_{th}$) distribution of the selected memory cell(s) now shifts to the second programmable state (or "B" state according to this particular example), an appropriate bit line voltage ($VDD_{SA}$) is applied to the memory structure, thereby generating an "inhibit" condition with respect to the first programmable state (as indicated in FIG. 16). Also during the second program pulse 1110, a "zero voltage" condition (i.e., VSS=0 volts or "ground") continues to be maintained with respect to the one or more selected (or addressed) bit line(s) of the memory structure. Additionally, as depicted in FIG. 16, at a second point in time ($T_2$), an appropriate second programming voltage ($V_{PGM2}$) having an upward magnitude that is greater than the magnitude of the initial programming voltage ($V_{PGM1}$) (as was applied during the first program pulse 1100), is then applied to the control gate(s) of the one or more selected memory cell(s) of the memory structure according to corresponding selected (or addressed) word line(s) of the memory structure. Accordingly, the application of the second programming voltage ($V_{PGM2}$) generates a resulting voltage differential that is equal to the difference between the second programming voltage ($V_{PGM2}$) and the "zero voltage" condition (VSS) occurring at the channel region. As such, this resulting voltage differential induces an additional shift in the threshold voltage ($V_{th}$) distribution to the second programmed state (or the "B" state) with respect to the selected memory cell(s).

Lastly, according to the exemplary embodiment that is depicted in FIG. 16, the programming operation of a selected population of MLC type cells of a memory structure is completed according to a third program pulse 1120, i.e., which results in the programming of a third programmed state (or "C" state according to this particular example). Similar to the programming of the first and second programmed states, an appropriate "pre-charge" bit line voltage ($VDD_{SA}$) is applied to the memory structure in order to generate an "inhibit" condition with respect to both the first and second programmable states (referred to as "A" and "B" states according to this particular example), such that the programming of the first and the second programmable states ceases, and any further programming occurs with respect to the third programmable state. Also during the third program pulse 1120, a "zero voltage" condition (i.e., VSS=0 volts or "ground") continues to be maintained with respect to the one or more selected (or addressed) bit line(s) of the memory structure. In addition, as shown in FIG. 16, during the third program pulse 1120 and at a third point in time ($T_3$), an appropriate third programming voltage ($V_{PGM3}$) is applied to the control gate(s) of one or more selected memory cell(s) of the memory structure according to the corresponding selected (or addressed) word line(s) of the memory structure. Furthermore, as indicated in FIG. 16, a magnitude of the third programming voltage ($V_{PGM3}$) is greater than the respective magnitudes of the first and second programming voltages ($V_{PGM1}$ and $V_{PGM2}$, respectively). Accordingly, as a result of applying the third programming voltage ($V_{PGM3}$), a voltage differential is thereby generated, wherein the voltage differential is equal to the difference occurring between the third programming voltage ($V_{PGM3}$) and the "zero voltage" condition (VSS) present at the channel region. Once again, this resulting voltage differential correspondingly induces an additional shift in the threshold voltage (Val) distribution with respect to the selected memory cell(s) to the third programmed state (which is referenced as the "C" state in this particular example).

Figure 18:
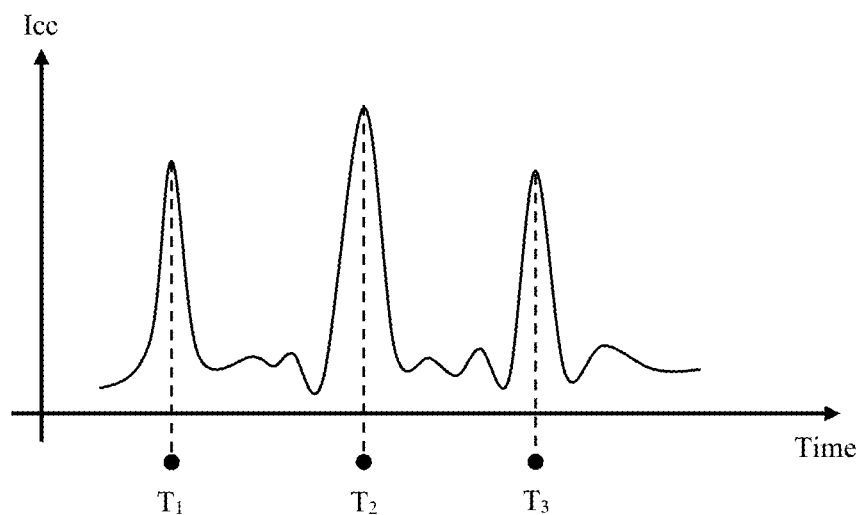
FIG. 18 is a graphical plot depicting the power consumption as a result of the programming operation according to the exemplary embodiment depicted in FIG. 16.

Thus, according to the exemplary embodiment depicted in FIG. 16, to effectively complete a programming operation with respect to MLC type memory cells, the programming operation may comprise three distinct program pulses (1100, 1110, 1120), wherein each pulse consumes a period of time ($T_{prog}$) to perform. According to certain observations (experimental and/or in situ), a disparity in the power draw or the amount of power consumed by the memory device may exist between the three program pulses as a result of the electrical behavior that is occurring. Referring now to the graphical plot that is set forth in FIG. 18, there is generally depicted the power draw or consumption (Icc) of a memory device as a function of the elapsed time with respect to the three program pulses that are outlined in the exemplary embodiment of FIG. 16. As depicted in FIG. 18, according to various observations, the amount of power consumed by a given memory device during the first program pulse (with the peak occurring at time $T_1$) is on par and consistent with the amount of power consumed during the third program pulse (with the peak occurring at time $T_3$). However, as also shown in FIG. 18, a distinct and appreciable increase or spike in the amount of power that is consumed occurs during the second program pulse (with the peak occurring at time $T_2$). Accordingly, this exhibited spike constitutes a significant power draw that, over time, may damage the memory device and degrade an associated power supply. The origin, or the nexus, of this spike or jump in power consumption occurring during the second program pulse in this embodiment is likely due to the particular voltage biasing scheme of the bit line(s) that is applied during the second program pulse. Specifically, as depicted according to the waveform perspective in FIG. 16, during the first program pulse and the third program pulse, the percentage of bit line(s) of the memory device experiencing the same voltage condition (i.e., either an "inhibit" condition or a "zero voltage" condition) is higher relative to the second program pulse. In the second program pulse, approximately only half of the bit line(s) of the memory device experience the same voltage condition. Therefore, the probability of a voltage swing (i.e., the voltage swing between the "inhibit" condition and the "zero voltage" condition) between adjacent bit lines of the memory device is significantly higher during the second program pulse. Consequently, more power is consumed during the second program pulse relative to the first and third program pulses. Thus, boosting the efficiency of the programming operation may be accomplished by, for example, altering a balance of the voltage biasing scheme of the bit line(s) applied during one or more of the three program pulses. The following description illustrates, in general terms, a non-limiting example of such a modified programming operation.

Figure 19:
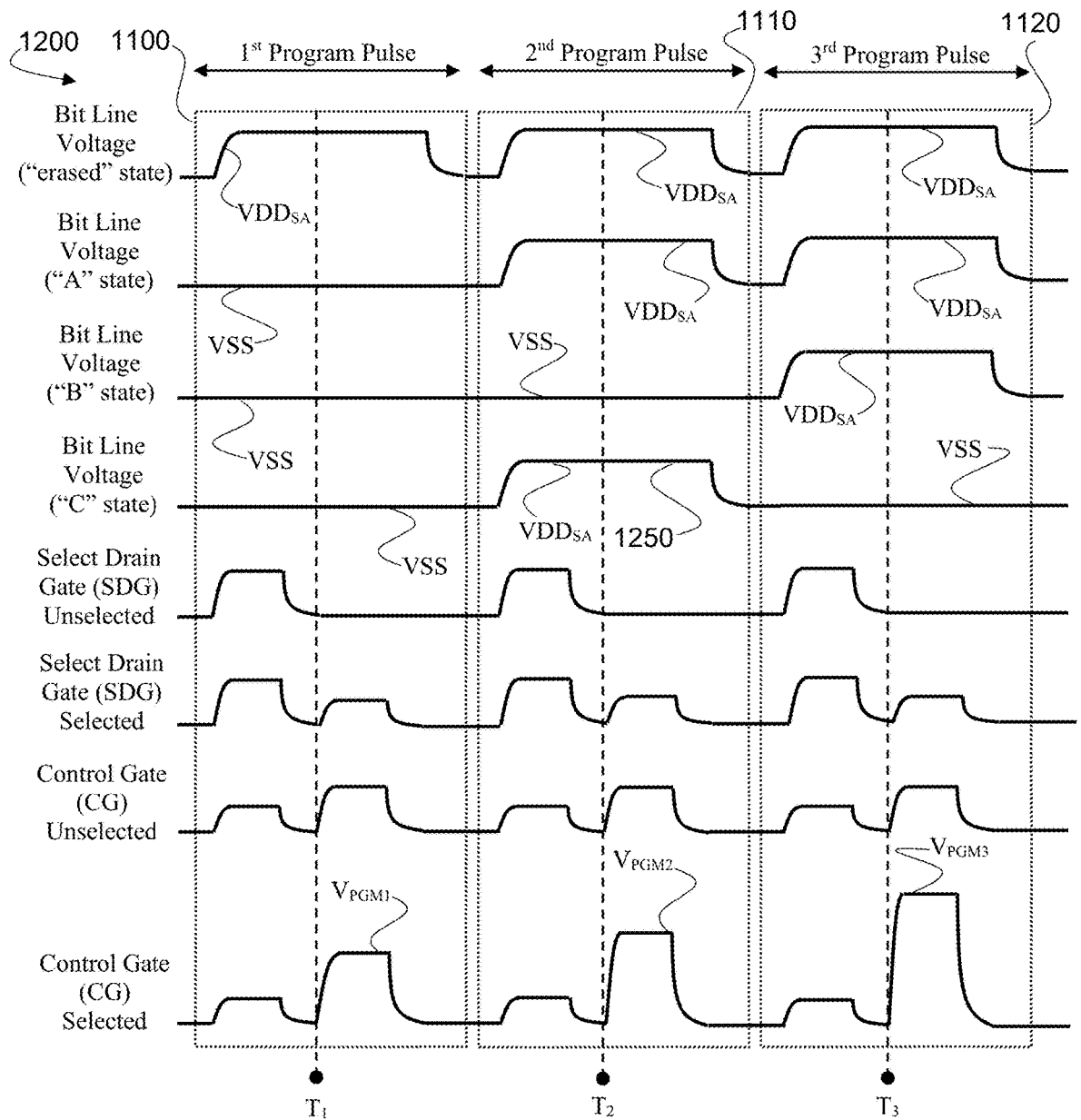
FIG. 19 is a signal waveform or signal timing diagram that generally depicts a programming operation with respect to a population of MLC NAND-type memory cells, in accordance with another exemplary embodiment.
Figure 20:
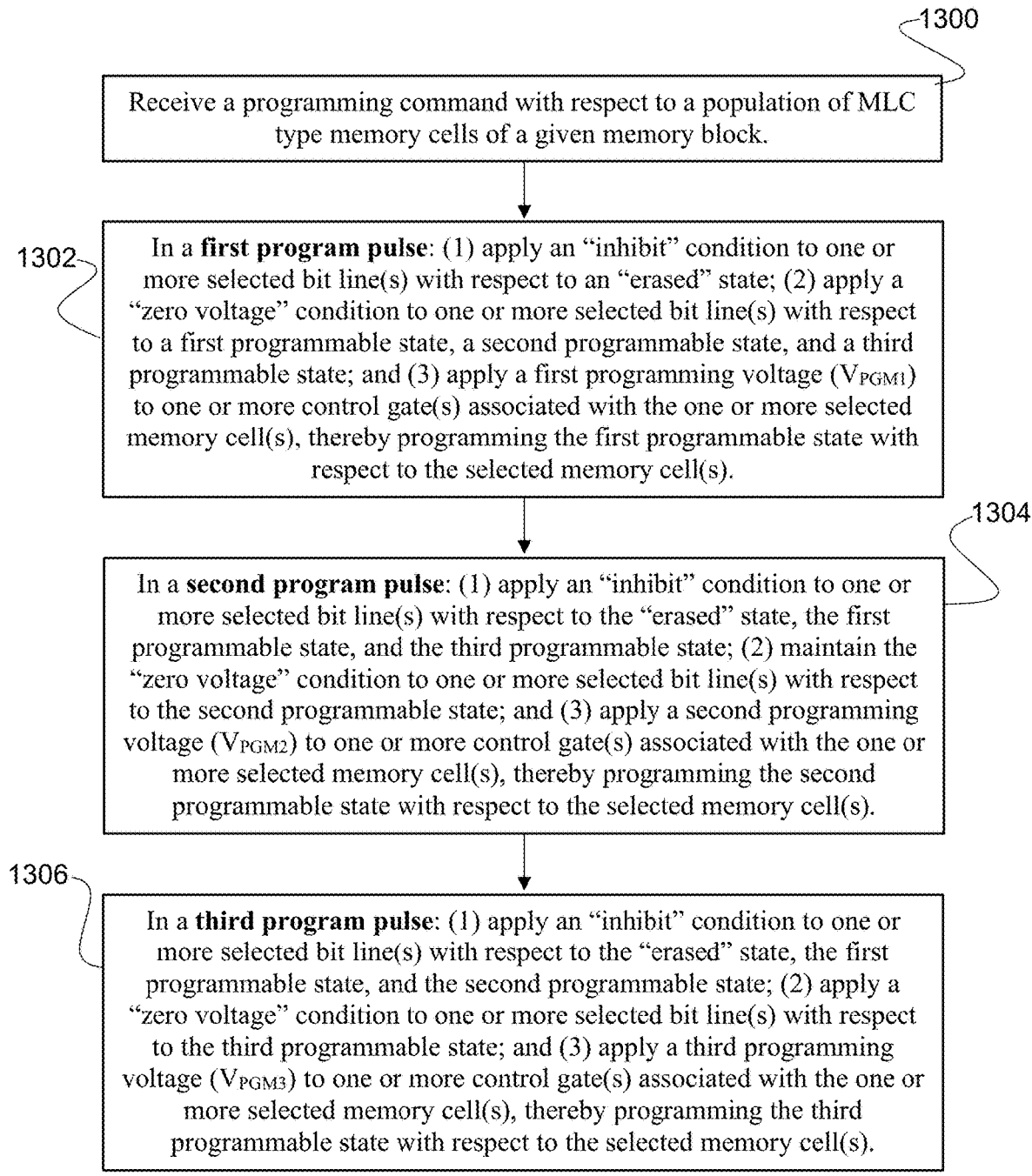
FIG. 20 is a flow diagram generally depicting a programming operation in accordance with the exemplary embodiment depicted in FIG. 19.

Beginning with the exemplary embodiment depicted in FIGS. 19 and 20, there is generally shown in FIG. 19, from the perspective of a signal waveform 1200, a modified programming operation with respect to a selected population of MLC type memory cells. Additionally, FIG. 20 is a flow diagram that generally sets forth the several steps of the programming operation in accordance with this specific embodiment. As explained below, the programming operation according to this particular embodiment is identical to the programming operation depicted in FIG. 16, with the exception of the second program pulse 1110.

Accordingly, as indicated in FIG. 20, a programming operation with respect to a population of MLC type memory cells commences at a step 1300. Thus, at step 1302, a first program pulse 1100 is initiated. Specifically, according to the signal waveform 1200 that is provided in FIG. 19, an appropriate "pre-charge" bit line voltage ($VDD_{SA}$) is applied to the memory structure in order to generate an "inhibit" condition with respect to an "erased" state. Further, a "zero voltage" condition (i.e., VSS=0 volts or "ground") is applied to one or more selected bit line(s) with respect to a first programmable state, a second programmable state, and a third programmable state (or "A" state, "B" state, and "C" state, respectively, according to this example). Furthermore, upon reaching a first point in time ($T_1$) during the first program pulse 1100, a first programming voltage ($V_{PGM1}$) is then applied to the control gate(s) of one or more selected memory cell(s) of the memory structure by way of the corresponding selected (or addressed) word line(s) of the memory structure. Due to the "zero voltage" condition that is present at the channel region with respect to the first programmable state, application of the first programming voltage ($V_{PGM1}$) results in a voltage differential equal to the difference between the first programming voltage ($V_{PGM1}$) and the "zero voltage" condition (VSS) that is present at the channel region. Consequently, this voltage differential induces a shift in the threshold voltage ($V_{th}$) distribution to the first programmed state (or "A" state) with respect to the selected memory cell(s).

Next, as indicated at step 1304, a second program pulse 1110 is initiated. Specifically, as depicted in FIG. 19, an "inhibit" condition is applied to one or more selected bit line(s) with respect to the "erased" state and the first programmable state. Further, in stark contrast to the second program pulse 1110 in the exemplary embodiment depicted in FIG. 16, an "inhibit" condition is also applied herein with respect to the third programmable state (see region 1250 in FIG. 19). The "zero voltage" condition is maintained with respect to the second programmable state. Also, at a second point in time ($T_2$) that occurs during the second program pulse 1110, a second programming voltage ($V_{PGM2}$) is applied to the control gate(s) of one or more selected memory cell(s), thereby resulting in the programming of the second programmed state (or "B" state) as described in detail above.

Further, the programming operation continues at step 1306 in order to program the remaining programmable state, i.e., the third programmable state (or "C" state). As indicated in FIG. 19, a third program pulse 1120 is initiated. Specifically, an "inhibit" condition is applied to one or more selected bit line(s) with respect to the "erased" state, first programmable state, and second programmable state. In addition, a "zero voltage" condition is applied to one or more selected bit line(s) with respect to the third programmable state. Further, at a third point in time ($T_3$) that occurs during the third program pulse 1120, a third programming voltage ($V_{PGM3}$) is applied to the control gate(s) of one or more selected memory cell(s), thereby resulting in the programming of the third programmed state (or "C" state) as described in detail above.

Importantly, because the bit line voltage biasing scheme occurring during the second program pulse 1110 is now altered to comprise applying an "inhibit" condition not only with respect to the "erased" state and the first programmable state, but also with respect to the third programmable state, the percentage of adjacent bit line pairs of the memory structure that may experience the "inhibit" condition-to-"zero voltage" condition voltage swing is effectively reduced. Further, this modification to the voltage biasing scheme does not interfere with the programming operation.

In the exemplary embodiments described above, the various programming voltages ($V_{PGM}$) applied may be pre-determined as being the optimal voltage level(s) according to, for example, experimental and/or in situ data and observations specifically pertaining to a given memory device. More specifically, the applied programming voltages ($V_{PGM}$) may be pre-determined based upon the optimal voltage level(s) that are the most effective and reliable in generating the necessary voltage differential for producing the intended shift in the threshold voltage ($V_{th}$) distribution with respect to a programmable state. Alternatively, the applied programming voltages ($V_{PGM}$) may be dynamically sensed and determined while the memory device is in use.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:

1. A method for programming a memory array of a non-volatile memory structure, comprising:
   initiating a programming operation with respect to a population of MLC type memory cells comprising the memory array, the population of MLC type memory cells being in electrical communication with a plurality of bit lines, wherein the programming operation comprises:
   in a first program pulse, programming a first programmable state according to a first programming voltage;
   in a second program pulse, programming a second programmable state according to a second programming voltage; and in a third program pulse, programming a third programmable state according to a third programming voltage, wherein during each of the first program pulse, second program pulse, and third program pulse, applying:
 an inhibit condition to a first set of bit lines of the plurality of bit lines of the memory array; and
 a zero voltage condition to a second set of bit lines of the plurality of bit lines of the memory array, the second set of bit lines being different than the first set of bit lines, such that less than half of adjacent bit lines of the memory array experience a voltage swing between the inhibit condition and the zero voltage condition.

2. The method according to claim 1, wherein:
a magnitude of the second programming voltage is greater than a magnitude of the first programming voltage; and
a magnitude of the third programming voltage is greater than the magnitude of the second programming voltage.

3. The method according to claim 1, wherein application of the zero voltage condition comprises connecting the one or more bit lines to ground.

4. The method according to claim 1, wherein the first program pulse comprises:
applying:
 the inhibit condition to the one or more selected bit lines with respect to the "erased" state;
 the zero voltage condition to the one or more selected bit lines with respect to the first programmable state, the second programmable state, and the third programmable state; and
 the first programmable voltage to one or more control gates associated with one or more selected memory cells.

5. The method according to claim 4, wherein the second program pulse comprises:
applying:
 the inhibit condition to the one or more selected bit lines with respect to the "erased" state, the first programmable state, and the third programmable state;
 the zero voltage condition to the one or more selected bit lines with respect to the second programmable state; and
 the second programmable voltage to one or more control gates associated with the one or more selected memory cells.

6. The method according to claim 5, wherein the third program pulse comprises:
applying:
 the inhibit condition to the one or more selected bit lines with respect to the "erased" state, the first programmable state, and the second programmable state;
 the zero voltage condition to the one or more selected bit lines with respect to the third programmable state; and
 the third programmable voltage to one or more control gates associated with the one or more selected memory cells.

7. A memory controller, comprising:
a communication pathway configured to couple to a memory array of a non-volatile memory structure; and
the memory controller is configured to:
 initiate a programming operation with respect to a population of MLC type memory cells comprising the memory array, the population of MLC type memory cells being in electrical communication with a plurality of bit lines, wherein the programming operation comprises:
  in a first program pulse, programming a first programmable state according to a first programming voltage;
  in a second program pulse, programming a second programmable state according to a second programming voltage; and
  in a third program pulse, programming a third programmable state according to a third programming voltage, wherein
 during each of the first program pulse, second program pulse, and third program pulse, apply:
  an inhibit condition to a first set of bit lines of the memory array; and
  a zero voltage condition to a second set of bit lines of the memory array, the second set of bit lines being different than the first set of bit lines, such that less than half of adjacent bit lines of the memory array experience a voltage swing between the inhibit condition and the zero voltage condition.

8. The memory controller according to claim 7, wherein:
a magnitude of the second programming voltage is greater than a magnitude of the first programming voltage; and
a magnitude of the third programming voltage is greater than the magnitude of the second programming voltage.

9. The memory controller according to claim 7, wherein application of the zero voltage condition comprises connecting the one or more bit lines to ground.

10. The memory controller according to claim 7, wherein the first program pulse comprises application of:
 the inhibit condition to the one or more selected bit lines with respect to the "erased" state;
 the zero voltage condition to the one or more selected bit lines with respect to the first programmable state, the second programmable state, and the third programmable state; and
 the first programmable voltage to one or more control gates associated with one or more selected memory cells.

11. The memory controller according to claim 10, wherein the second program pulse comprises application of:
 the inhibit condition to the one or more selected bit lines with respect to the "erased" state, the first programmable state, and the third programmable state;
 the zero voltage condition to the one or more selected bit lines with respect to the second programmable state; and
 the second programmable voltage to one or more control gates associated with the one or more selected memory cells.

12. The memory controller according to claim 11, wherein the third program pulse comprises application of:
 the inhibit condition to the one or more selected bit lines with respect to the "erased" state, the first programmable state, and the second programmable state;
 the zero voltage condition to the one or more selected bit lines with respect to the third programmable state; and
 the third programmable voltage to one or more control gates associated with the one or more selected memory cells.

13. A non-volatile memory system, comprising:
a memory array comprising a population of MLC type memory cells, the population of MLC type memory cells being in electrical communication with a plurality of bit lines; and
a memory controller coupled to the memory array and:
  initiating a programming operation with respect to the memory array, wherein the programming operation comprises:
    in a first program pulse, programming a first programmable state according to a first programming voltage;
    in a second program pulse, programming a second programmable state according to a second programming voltage; and
    in a third program pulse, programming a third programmable state according to a third programming voltage, wherein
  during each of the first program pulse, second program pulse, and third program pulse, applying:
    an inhibit condition to a first set of bit lines of the plurality of bit lines of the memory array; and
    a zero voltage condition to a second set of bit lines of the plurality of bit lines of the memory array, the second set of bit lines being different than the first set of bit lines such that less than half of adjacent bit lines of the memory array experience a voltage swing between the inhibit condition and the zero voltage condition.

14. The non-volatile memory system according to claim 13, wherein:
a magnitude of the second programming voltage is greater than a magnitude of the first programming voltage; and
a magnitude of the third programming voltage is greater than the magnitude of the second programming voltage.

15. The non-volatile memory system according to claim 13, wherein application of the zero voltage condition comprises connecting the one or more bit lines to ground.

16. The non-volatile memory system according to claim 13, wherein during the first program pulse, further comprising the memory controller:
applying:
  the inhibit condition to the one or more selected bit lines with respect to the "erased" state;
  the zero voltage condition to the one or more selected bit lines with respect to the first programmable state, the second programmable state, and the third programmable state; and
  the first programmable voltage to one or more control gates associated with one or more selected memory cells.

17. The non-volatile memory system according to claim 16, wherein during the second program pulse, further comprising the memory controller:
applying:
  the inhibit condition to the one or more selected bit lines with respect to the "erased" state, the first programmable state, and the third programmable state;
  the zero voltage condition to the one or more selected bit lines with respect to the second programmable state; and
  the second programmable voltage to one or more control gates associated with the one or more selected memory cells.

18. The non-volatile memory system according to claim 17, wherein during the third program pulse, further comprising the memory controller:
applying:
  the inhibit condition to the one or more selected bit lines with respect to the "erased" state, the first programmable state, and the second programmable state;
  the zero voltage condition to the one or more selected bit lines with respect to the third programmable state; and
  the third programmable voltage to one or more control gates associated with the one or more selected memory cells.

* * * * *